US011869991B2

(12) United States Patent
Shih et al.

(10) Patent No.: US 11,869,991 B2
(45) Date of Patent: Jan. 9, 2024

(54) SEMICONDUCTOR DEVICE AND METHOD OF MAKING

(71) Applicant: TAIWAN SEMICONDUCTOR MANUFACTURING COMPANY LIMITED, Hsin-Chu (TW)

(72) Inventors: Chih-Tsung Shih, Hsinchu (TW); Hau-Yan Lu, Hsinchu (TW); Felix Tsui, Cupertino, CA (US); Stefan Rusu, Sunnyvale, CA (US); Chewn-Pu Jou, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 229 days.

(21) Appl. No.: 17/189,379

(22) Filed: Mar. 2, 2021

(65) Prior Publication Data

US 2022/0093808 A1 Mar. 24, 2022

Related U.S. Application Data

(60) Provisional application No. 63/080,657, filed on Sep. 18, 2020.

(51) Int. Cl.
*H01L 31/0232* (2014.01)
*H01L 31/18* (2006.01)
*H01L 31/0352* (2006.01)

(52) U.S. Cl.
CPC ......... *H01L 31/02327* (2013.01); *H01L 31/035281* (2013.01); *H01L 31/18* (2013.01)

(58) Field of Classification Search
CPC ....... H01L 31/02327; H01L 31/035281; H01L 31/18; H01L 31/105; G02B 6/1228; G02B 6/136; G02F 1/015; G02F 1/025
See application file for complete search history.

(56) References Cited

U.S. PATENT DOCUMENTS

| | | | | |
|---|---|---|---|---|
| 8,160,404 | B2* | 4/2012 | Pan | H01L 31/1055 385/129 |
| 9,703,043 | B2* | 7/2017 | Chen | G02B 6/34 |
| 9,897,753 | B2* | 2/2018 | Bok | G02B 6/1228 |
| 10,340,661 | B2* | 7/2019 | Caër | H01S 5/343 |
| 10,546,963 | B2* | 1/2020 | Hon | H01L 31/022408 |
| 11,101,256 | B2* | 8/2021 | Yu | H04B 10/524 |
| 11,105,975 | B2* | 8/2021 | Abediasl | G02B 6/12 |

(Continued)

FOREIGN PATENT DOCUMENTS

| | | | | |
|---|---|---|---|---|
| CN | 103426915 | A | | 12/2013 |
| CN | 106784072 | A * | 5/2017 | ........... G02F 1/0121 |

(Continued)

*Primary Examiner* — Earl N Taylor
(74) *Attorney, Agent, or Firm* — COOPER LEGAL GROUP LLC

(57) ABSTRACT

A semiconductor device is provided. The semiconductor device includes a waveguide over a first dielectric layer. A first portion of the waveguide has a first width and a second portion of the waveguide has a second width larger than the first width. The semiconductor device includes a first doped semiconductor structure and a second doped semiconductor structure. The second portion of the waveguide is between the first doped semiconductor structure and the second doped semiconductor structure.

20 Claims, 26 Drawing Sheets

(56) References Cited

U.S. PATENT DOCUMENTS

| | | | |
|---|---|---|---|
| 11,378,750 B2* | 7/2022 | Song | H01L 31/1804 |
| 2006/0133754 A1* | 6/2006 | Patel | G02B 6/1228 |
| | | | 385/129 |
| 2007/0116398 A1* | 5/2007 | Pan | H01L 27/1443 |
| | | | 385/9 |
| 2009/0324164 A1* | 12/2009 | Reshotko | G02B 6/1228 |
| | | | 257/432 |
| 2011/0180795 A1* | 7/2011 | Lo | G02F 1/025 |
| | | | 438/45 |
| 2012/0149178 A1* | 6/2012 | Fedeli | G02F 1/025 |
| | | | 257/E21.09 |
| 2012/0177318 A1* | 7/2012 | Zheng | G02F 1/025 |
| | | | 385/1 |
| 2012/0189239 A1* | 7/2012 | Tu | G02F 1/025 |
| | | | 385/2 |
| 2012/0207424 A1* | 8/2012 | Zheng | G02F 1/01708 |
| | | | 385/2 |
| 2013/0051727 A1* | 2/2013 | Mizrahi | G02B 6/26 |
| | | | 385/28 |
| 2015/0056740 A1* | 2/2015 | Menezo | H01L 31/105 |
| | | | 438/69 |
| 2015/0293384 A1* | 10/2015 | Ogawa | G02F 1/2257 |
| | | | 385/11 |
| 2015/0316793 A1* | 11/2015 | Ayazi | G02F 1/025 |
| | | | 438/31 |
| 2015/0346520 A1* | 12/2015 | Lee | G02F 1/025 |
| | | | 385/2 |
| 2015/0362764 A1* | 12/2015 | Cunningham | G02F 1/0018 |
| | | | 385/2 |
| 2016/0043262 A1* | 2/2016 | Okumura | H04J 14/02 |
| | | | 438/69 |
| 2016/0293788 A1* | 10/2016 | Okumura | H01L 31/105 |
| 2017/0155452 A1* | 6/2017 | Nagra | G02F 1/0121 |
| 2018/0335569 A1* | 11/2018 | Saito | G02B 6/136 |
| 2018/0335653 A1* | 11/2018 | Mentovich | G01M 11/00 |
| 2019/0033518 A1* | 1/2019 | Anderson | G02B 6/12002 |
| 2019/0131772 A1* | 5/2019 | Caër | H01S 5/3054 |
| 2019/0139950 A1* | 5/2019 | Yu | G02F 1/01708 |
| 2020/0012043 A1* | 1/2020 | Abediasl | H01L 31/02327 |
| 2020/0124791 A1* | 4/2020 | Bayn | H01L 31/02327 |
| 2020/0379174 A1* | 12/2020 | Prosyk | H01S 5/2275 |
| 2021/0135024 A1* | 5/2021 | Chiang | H01L 31/1808 |
| 2021/0157068 A1* | 5/2021 | Gothoskar | G02B 6/12004 |
| 2021/0223478 A1* | 7/2021 | Song | G02B 6/1228 |
| 2021/0247633 A1* | 8/2021 | Chen | G02B 6/0013 |
| 2021/0271024 A1* | 9/2021 | Chen | G02B 6/132 |
| 2021/0278598 A1* | 9/2021 | Bian | G02B 6/3512 |
| 2022/0093808 A1* | 3/2022 | Shih | H01L 31/02327 |
| 2023/0011341 A1* | 1/2023 | Maeda | H01L 31/02327 |

FOREIGN PATENT DOCUMENTS

| | | | | |
|---|---|---|---|---|
| CN | 110088916 A | | 8/2019 | |
| GB | 2483283 A | * | 3/2012 | G02B 6/1228 |
| GB | 2557694 A | * | 6/2018 | G02F 1/0121 |
| GB | 2564158 | | 1/2019 | |
| WO | 2011108508 A1 | | 9/2011 | |

* cited by examiner

SEMICONDUCTOR DEVICE AND METHOD OF MAKING

RELATED APPLICATION

This application claims priority to U.S. Provisional Patent Application 63/080,657, titled "SIGNAL CONTROL" and filed on Sep. 18, 2020, which is incorporated herein by reference.

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
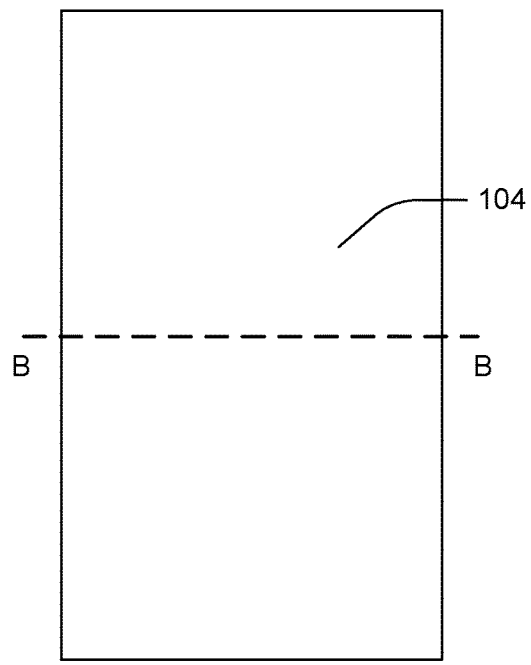
FIGS. 1A-1B illustrate a semiconductor device at a stage of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

Some embodiments relate to a semiconductor device. In accordance with some embodiments, the semiconductor device comprises a waveguide, a first doped semiconductor structure, and a second doped semiconductor structure. The waveguide comprises a first portion having a first width and a second portion having a second width larger than the first width. The second portion of the waveguide is between the first doped semiconductor structure and the second doped semiconductor structure. In some embodiments, the first doped semiconductor structure is an n-doped semiconductor structure and the second doped semiconductor structure is a p-doped semiconductor structure. Other structures and/or configurations of at least one of the waveguide, the first doped semiconductor structure, or the second doped semiconductor structure are within the scope of the present disclosure.

In some embodiments, the semiconductor device comprises at least one of a communication device, such as a receiver, a transmitter, a transceiver, a photonic device, such as a silicon-based photonic integrated circuit (IC), or a different type of device. The semiconductor device is configured for at least one of optical communication or propagation of an optical signal. Other structures and/or configurations of the semiconductor device are within the scope of the present disclosure.

In some embodiments, at least one of the second portion of the waveguide, the first doped semiconductor structure, or the second doped semiconductor structure form at least one of a modulation structure or a phase shifter structure. In some embodiments, free carriers are injected into the second portion of the waveguide to at least one of control an optical signal propagated via the waveguide, modulate the optical signal, or provide a phase shift of the optical signal. Implementing the second portion of the waveguide to have the second width larger than the first width provides for lower signal loss of the optical signal in the second portion of the waveguide.

In some embodiments, the waveguide comprises a third portion between the first portion of the waveguide and the second portion of the waveguide. The third portion of the waveguide comprises at least one of a first tapered sidewall extending from the first portion of the waveguide to the second portion of the waveguide or a second tapered sidewall extending from the first portion of the waveguide to the second portion of the waveguide. Other structures and/or configurations of the third portion of the waveguide are within the scope of the present disclosure. Implementing the third portion of the waveguide to have at least one of the first tapered sidewall or the second tapered sidewall at least one of provides for excitement of a first mode of the optical signal or inhibits formation of one or more modes of the optical signal, such as one or more modes other than the first mode of the optical signal.

FIGS. 1A-15B illustrate a semiconductor device 100 at various stages of fabrication, in accordance with some embodiments. FIGS. 1A, 2A, 3A, 4A, 5A, 6A, 7A, 8A, 9A, 10A, 11A, 12A, 13A, 14A, and 15A illustrate top views of the semiconductor device 100 at various stages of fabrication. FIGS. 1B, 2B, 3B, 4B, 5B, 6B, 7B, 8B, 9B, 10B, 11B, 12B, 13B, 14B, and 15B illustrate cross-sectional views of the semiconductor device 100 taken along lines B-B of FIGS. 1A, 2A, 3A, 4A, 5A, 6A, 7A, 8A, 9A, 10A, 11A, 12A, 13A, 14A, and 15A, respectively.

In some embodiments, the semiconductor device 100 comprises at least one of a communication device, a receiver, a transmitter, a transceiver, a photonic device, a silicon-based photonic IC, or a different type of device. The semiconductor device 100 is configured for at least one of optical communication or propagation of an optical signal. Other structures and/or configurations of the semiconductor device 100 are within the scope of the present disclosure.

Figure 1B:
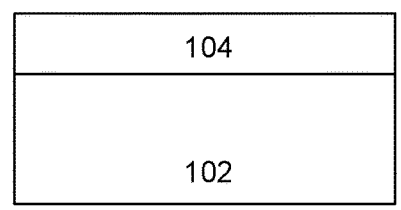

FIGS. 1A and 1B illustrate the semiconductor device 100 according to some embodiments. In some embodiments, the semiconductor device 100 comprises a first dielectric layer 104 and a substrate 102. The substrate 102 comprises at least one of an epitaxial layer, a silicon-on-insulator (SOI) structure, a wafer, or a die formed from a wafer. Other structures and/or configurations of the substrate 102 are within the scope of the present disclosure. The substrate 102 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. According to some embodiments, the substrate 102 comprises monocrystalline silicon, crystalline silicon with a <100> crystallographic orientation, crystalline silicon with a <110> crystallographic orientation or other suitable material. In some embodiments, the substrate 102 comprises at least one doped region.

In some embodiments, the first dielectric layer 104 is formed over the substrate 102. The first dielectric layer 104 at least one of overlies the substrate 102, is in direct contact with a top surface of the substrate 102, or is in indirect contact with the top surface of the substrate 102. In some embodiments, one or more layers, such as a buffer layer, are between the first dielectric layer 104 and the substrate 102.

In some embodiments, the first dielectric layer 104 comprises at least one of silicon, nitride, oxide, such as $SiO_2$, or other suitable material. Other structures and/or configurations of the first dielectric layer 104 are within the scope of the present disclosure. The first dielectric layer 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques.

Figure 2A:
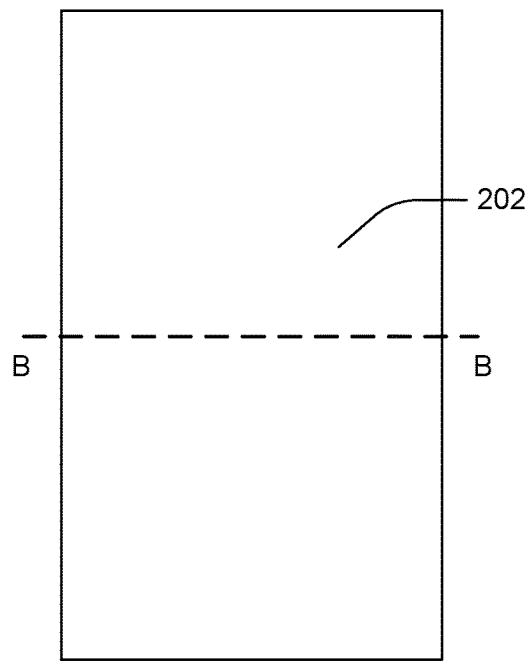
FIGS. 2A-2B illustrate a semiconductor device at a stage of fabrication, in accordance with some embodiments.
Figure 2B:
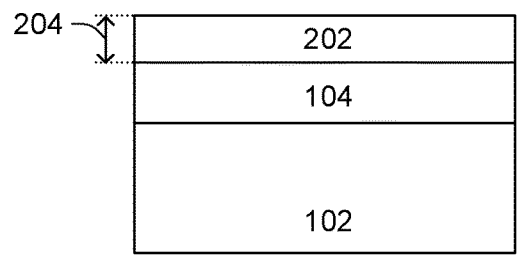

FIGS. 2A and 2B illustrate a semiconductor layer 202 formed over the first dielectric layer 104, according to some embodiments. The semiconductor layer 202 at least one of overlies the first dielectric layer 104, is in direct contact with a top surface of the first dielectric layer 104, or is in indirect contact with the top surface of the first dielectric layer 104. In some embodiments, one or more layers, such as a buffer layer, are between the semiconductor layer 202 and the first dielectric layer 104. The semiconductor layer 202 comprises at least one of a semiconductor material or other suitable material. According to some embodiments, the semiconductor layer 202 comprises silicon, such as monocrystalline silicon, crystalline silicon with a <100> crystallographic orientation, crystalline silicon with a <110> crystallographic orientation or other suitable material. Other structures and/or configurations of the semiconductor layer 202 are within the scope of the present disclosure. In some embodiments, the semiconductor layer 202 has a thickness 204 between about 2,000 angstroms and about 4,000 angstroms. Other values of the thickness 204 are within the scope of the present disclosure.

Figure 3A:
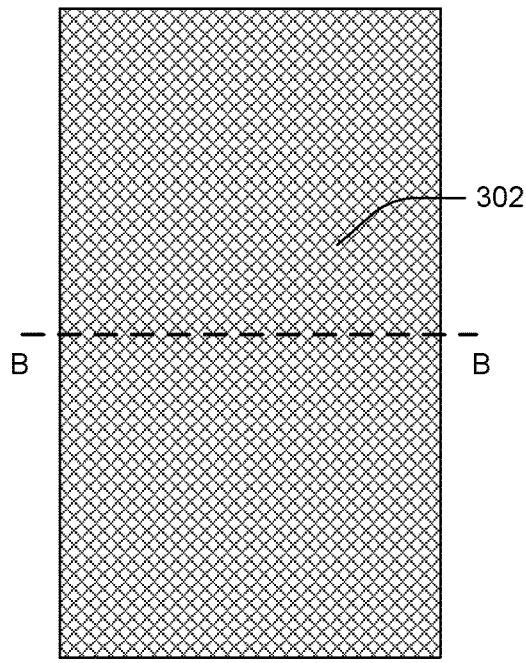
FIGS. 3A-3B illustrate a semiconductor device at a stage of fabrication, in accordance with some embodiments.
Figure 3B:
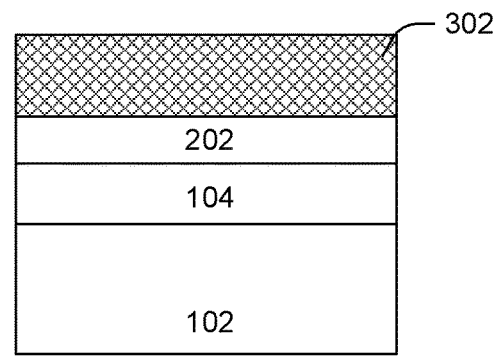

FIGS. 3A and 3B illustrate a first photoresist 302 formed over the semiconductor layer 202, according to some embodiments. The first photoresist 302 overlies the semiconductor layer 202. The first photoresist 302 is formed by at least one of PVD, sputtering, CVD, LPCVD, ALCVD, UHVCVD, RPCVD, ALD, MBE, LPE, spin on, growth, or other suitable techniques.

The first photoresist 302 comprises a light-sensitive material, where properties, such as solubility, of the first photoresist 302 are affected by light. The first photoresist 302 is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist.

Figure 4A:
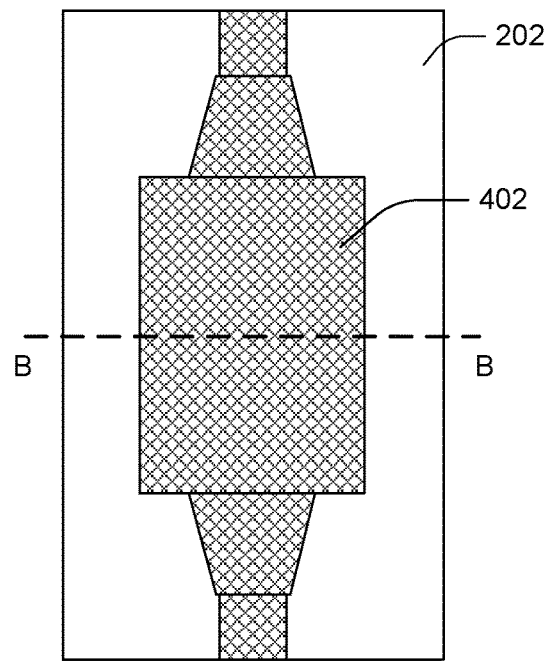
FIGS. 4A-4B illustrate a semiconductor device at a stage of fabrication, in accordance with some embodiments.
Figure 4B:
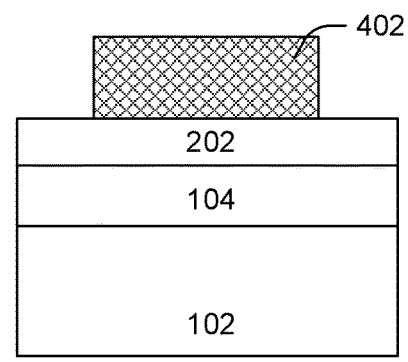

FIGS. 4A and 4B illustrate a first patterned photoresist 402 formed from the first photoresist 302, according to some embodiments. In some embodiments, the first patterned photoresist 402 covers portions of the semiconductor layer 202 to protect or shield the portions of the semiconductor layer 202 during an etching process.

Figure 5A:
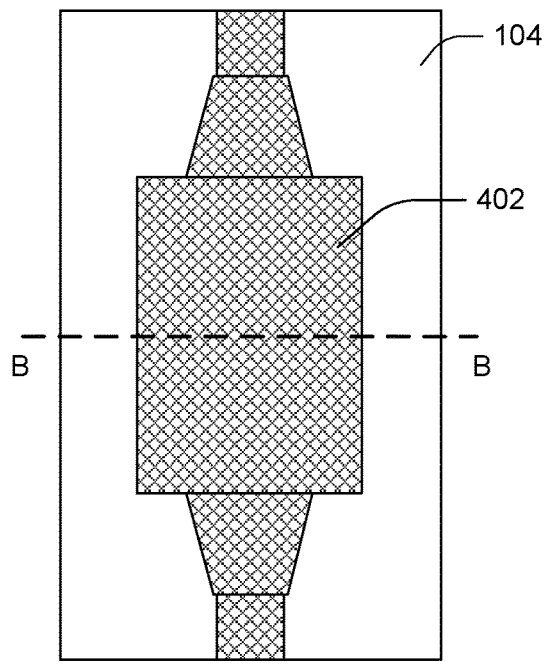
FIGS. 5A-5B illustrate a semiconductor device at a stage of fabrication, in accordance with some embodiments.
Figure 5B:
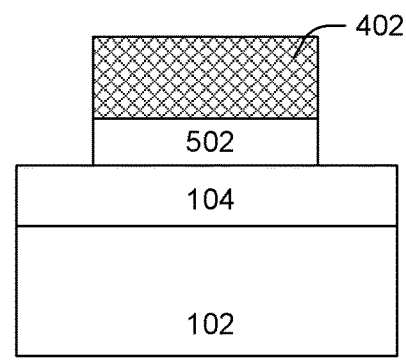

FIGS. 5A and 5B illustrate use of the first patterned photoresist 402 to pattern the semiconductor layer 202 to form a patterned semiconductor layer 502, according to some embodiments. In some embodiments, an etching process is performed to form the patterned semiconductor layer 502, where the first patterned photoresist 402 allows one or more etchants applied during the etching process to remove portions of the semiconductor layer 202 while the first patterned photoresist 402 protects or shields portions of the semiconductor layer 202 that are covered by the first patterned photoresist 402. The etching process is at least one of a dry etching process, a wet etching process, an anisotropic etching process, an isotropic etching process, or other suitable process. The etching process uses at least one of hydrogen fluoride (HF), diluted HF, a chlorine compound such as hydrogen chloride ($HCl_2$), hydrogen sulfide ($H_2S$), tetrafluoromethane ($CF_4$), or other suitable material. Other processes and/or techniques for forming the patterned semiconductor layer 502 are within the scope of the present disclosure.

Figure 6A:
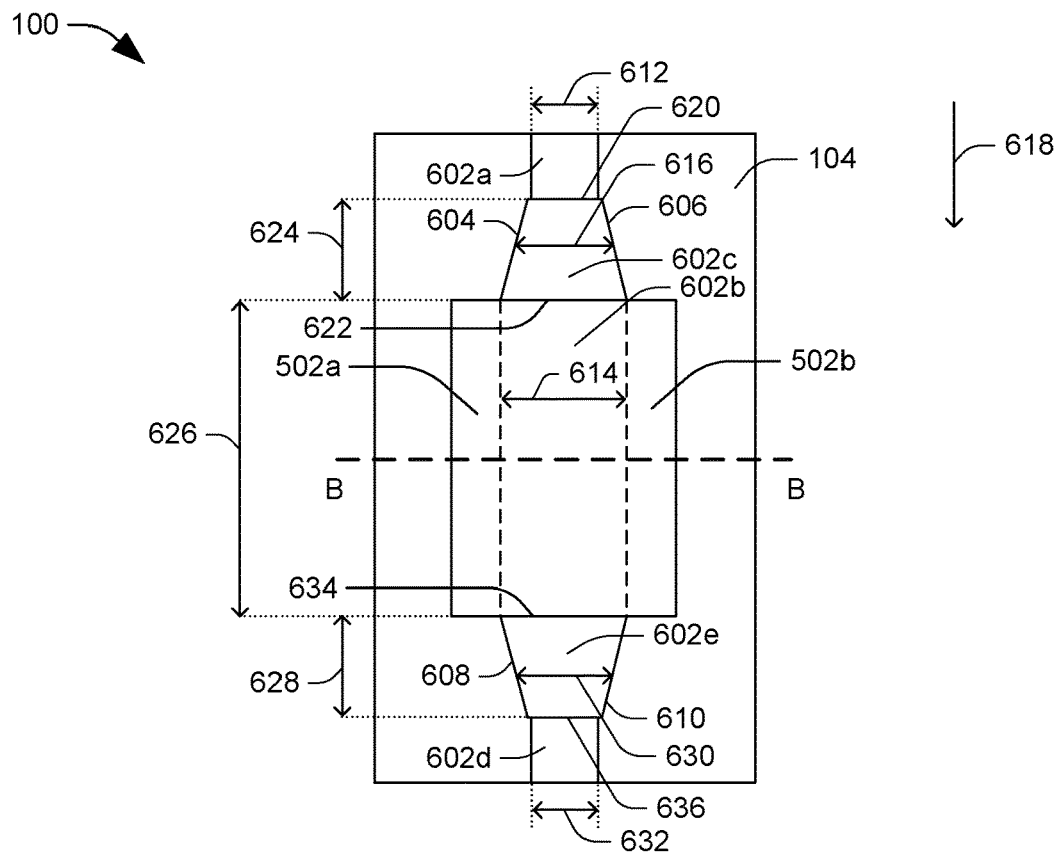
FIGS. 6A-6B illustrate a semiconductor device at a stage of fabrication, in accordance with some embodiments.
Figure 6B:
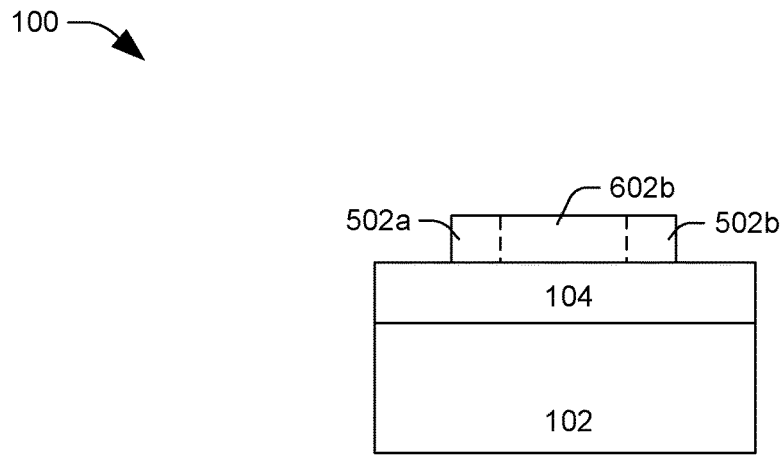

FIGS. 6A and 6B illustrate removal of the first patterned photoresist 402, according to some embodiments. The first patterned photoresist 402 is removed after the patterned semiconductor layer 502 is formed. The first patterned photoresist 402 is removed by at least one of chemical mechanical planarization (CMP), etching, or other suitable techniques. According to some embodiments, the first patterned photoresist 402 is at least one of stripped or washed away using at least one of HF, diluted HF, a chlorine compound such as $HCl_2$, $H_2S$, or other suitable material.

The patterned semiconductor layer 502 comprises a waveguide 602 comprising a first portion 602a and a second portion 602b. A first width 612 of the first portion 602a of the waveguide 602 is smaller than a second width 614 of the second portion 602b of the waveguide 602. In some embodiments, the second width 614 is at least three times larger than the first width 612, at least fourth times larger than the first width 612 or at least five times larger than the first width 612. The first width 612 is between about between about 10,000 angstroms to about 30,000 angstroms. The second width 614 is between about 30,000 angstroms to about 150,000 angstroms, such as between about 70,000 angstroms to about 120,000 angstroms. Other values of the first width 612 and the second width 614 are within the scope of the present disclosure. The second portion 602b of the waveguide 602 is between a first portion 502a of the patterned semiconductor layer 502 and a second portion 502b of the patterned semiconductor layer 502.

In some embodiments, the waveguide 602 comprises a third portion 602c between the first portion 602a of the waveguide 602 and the second portion 602b of the waveguide 602. The third portion 602c of the waveguide 602 extends from the first portion 602a of the waveguide 602 to the second portion 602b of the waveguide 602. In some embodiments, a third width 616 of the third portion 602c of the waveguide 602 increases along a direction 618 in which the third portion 602c of the waveguide 602 extends from the first portion 602a of the waveguide 602 to the second portion 602b of the waveguide 602. In some embodiments, at a first side 620 of the third portion 602c of the waveguide 602, the third width 616 is about equal to the first width 612 of the first portion 602a of the waveguide 602. In some embodiments, at the first side 620 of the third portion 602c of the waveguide 602, the third width 616 is different than the first width 612 of the first portion 602a of the waveguide 602. In some embodiments, at a second side 622 of the third portion 602c of the waveguide 602, the third width 616 is about equal to the second width 614 of the second portion 602b of the waveguide 602. In some embodiments, at the second side 622 of the third portion 602c of the waveguide 602, the third width 616 is different than the second width 614 of the second portion 602b of the waveguide 602.

In some embodiments, the third portion 602c has a first tapered sidewall 604 and a second tapered sidewall 606. The first tapered sidewall 604 of the third portion 602c of the waveguide 602 has a first slope. The second tapered sidewall 606 of the third portion 602c of the waveguide 602 has a second slope. The first slope is opposite in polarity relative to the second slope. In some embodiments, an absolute value of the second slope is about equal to an absolute value of the first slope. In some embodiments, the absolute value of the second slope is different than the absolute value of the first slope. The first tapered sidewall 604 and the second tapered sidewall 606 extend from the first side 620 of the third portion 602c of the waveguide 602 to the second side 622 of the third portion 602c of the waveguide 602. The first side 620 is adjacent the first portion 602a of the waveguide 602 and the second side 622 is adjacent the second portion 602b of the waveguide 602. In some embodiments, the first tapered sidewall 604 and the second tapered sidewall 606 extend from the first portion 602a of the waveguide 602 to the second portion 602b of the waveguide 602.

In some embodiments, the waveguide 602 comprises a fourth portion 602d. In some embodiments, at least one of the first portion 602a of the waveguide 602 extends in the direction opposite the direction 618, or the fourth portion 602d of the waveguide 602 extends in the direction 618. A fourth width 632 of the fourth portion 602d of the waveguide 602 is smaller than the second width 614 of the second portion 602b of the waveguide 602. In some embodiments, the second width 614 is at least three times larger than the fourth width 632, at least fourth times larger than the fourth width 632 or at least five times larger than the fourth width 632. The fourth width 632 is between about between about 10,000 angstroms to about 30,000 angstroms. Other values of fourth width 632 are within the scope of the present disclosure. In some embodiments, the fourth width 632 is about equal to the first width 612. In some embodiments, the fourth width 632 is different than the first width 612.

In some embodiments, the waveguide 602 comprises a fifth portion 602e between the fourth portion 602d of the waveguide 602 and the second portion 602b of the waveguide 602. The fifth portion 602e of the waveguide 602 extends from the second portion 602b of the waveguide 602 to the fourth portion 602d of the waveguide 602. In some embodiments, a fifth width 630 of the fifth portion 602e of the waveguide 602 increases along a direction opposite the direction 618. In some embodiments, at a first side 636 of the fifth portion 602e of the waveguide 602, the fifth width 630 is about equal to the fourth width 632 of the fourth portion 602d of the waveguide 602. In some embodiments, at the first side 636 of the fifth portion 602e of the waveguide 602, the fifth width 630 is different than the fourth width 632 of the fourth portion 602d of the waveguide 602. In some embodiments, at a second side 634 of the fifth portion 602e of the waveguide 602, the fifth width 630 is about equal to the second width 614 of the second portion 602b of the waveguide 602. In some embodiments, at the second side 634 of the fifth portion 602e of the waveguide 602, the fifth width 630 is different than the second width 614 of the second portion 602b of the waveguide 602. In some embodiments, a rate at which the fifth width 630 of the fifth portion 602e of the waveguide 602 increases along the direction opposite the direction 618 is about equal to a rate at which the third width 616 of the third portion 602c of the waveguide 602 increases along the direction 618. In some embodiments, the rate at which the fifth width 630 of the fifth portion 602e of the waveguide 602 increases along the direction opposite the direction 618 is different than the rate at which the third width 616 of the third portion 602c of the waveguide 602 increases along the direction 618.

In some embodiments, the fifth portion 602e has a third tapered sidewall 608 and a fourth tapered sidewall 610. The third tapered sidewall 608 of the fifth portion 602e of the waveguide 602 has a third slope. The fourth tapered sidewall 610 of the fifth portion 602e of the waveguide 602 has a fourth slope. The third slope is opposite in polarity relative to the fourth slope. In some embodiments, an absolute value of the fourth slope is about equal to an absolute value of the third slope. In some embodiments, the absolute value of the fourth slope is different than the absolute value of the third slope. The third tapered sidewall 608 and the fourth tapered sidewall 610 extend from the first side 636 of the fifth portion 602e of the waveguide 602 to the second side 634 of the fifth portion 602e of the waveguide 602. The first side 636 is adjacent the fourth portion 602d of the waveguide 602 and the second side 634 is adjacent the second portion 602b of the waveguide 602. In some embodiments, the third tapered sidewall 608 and the fourth tapered sidewall 610 extend from the fourth portion 602d of the waveguide 602 to the second portion 602b of the waveguide 602.

A length 626 of the second portion 602b is between about 150 micrometers to about 350 micrometers, such as between about 200 micrometers to about 300 micrometers. A length 624 of the third portion 602c of the waveguide 602 is between about 25 micrometers to about 200 micrometers, such as between about 50 micrometers to about 150 micrometers. A length 628 of the fifth portion 602e of the waveguide 602 is between about 25 micrometers to about 200 micrometers, such as between about 50 micrometers to about 150 micrometers. Other values of the length 626, the length 624, and the length 628 are within the scope of the present disclosure. In some embodiments, the length 624 is about equal to the length 628. In some embodiments, the length 624 is different than the length 628.

Figure 7A:
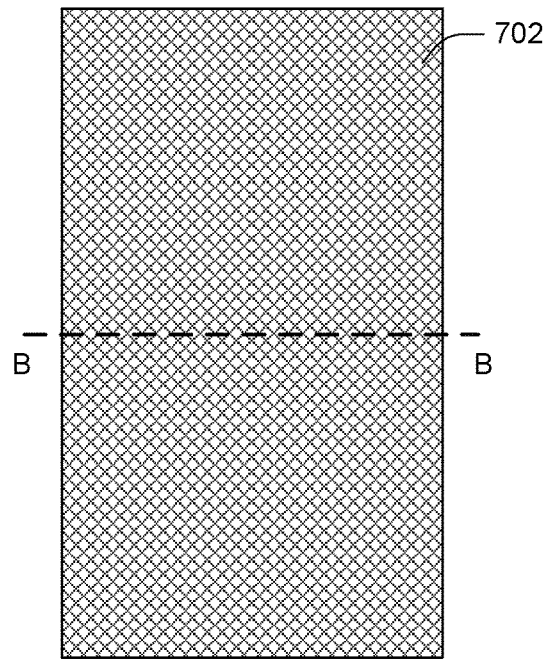
FIGS. 7A-7B illustrate a semiconductor device at a stage of fabrication, in accordance with some embodiments.
Figure 7B:
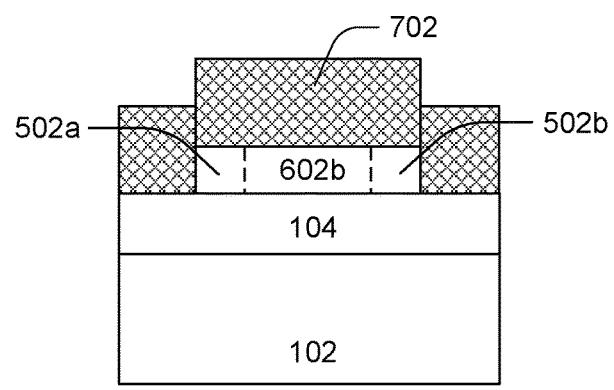

FIGS. 7A and 7B illustrate a second photoresist 702 formed over at least one of the waveguide 602, the first portion 502a of the patterned semiconductor layer 502, the second portion 502b of the patterned semiconductor layer 502, the first dielectric layer 104 or the substrate 102, according to some embodiments. The second photoresist 702 overlies at least one of the waveguide 602, the first portion 502a of the patterned semiconductor layer 502, the second portion 502b of the patterned semiconductor layer 502, or the first dielectric layer 104. The second photoresist 702 is formed by at least one of PVD, sputtering, CVD, LPCVD, ALCVD, UHVCVD, RPCVD, ALD, MBE, LPE, spin on, growth, or other suitable techniques.

Figure 8A:
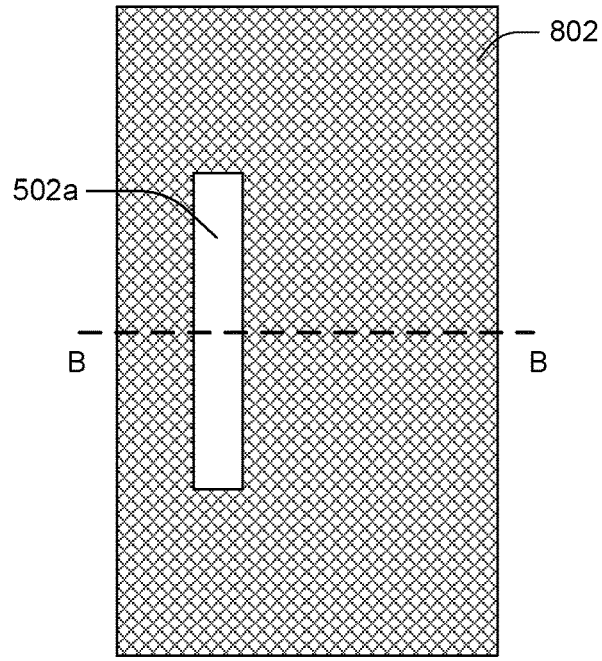
FIGS. 8A-8B illustrate a semiconductor device at a stage of fabrication, in accordance with some embodiments.
Figure 8B:
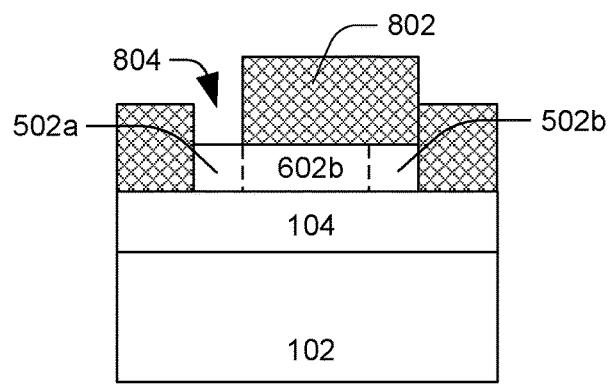

FIGS. 8A and 8B illustrate a second patterned photoresist 802 formed from the second photoresist 702, according to some embodiments. The second patterned photoresist 802 defines an opening 804 exposing the first portion 502a of the patterned semiconductor layer 502.

Figure 9A:
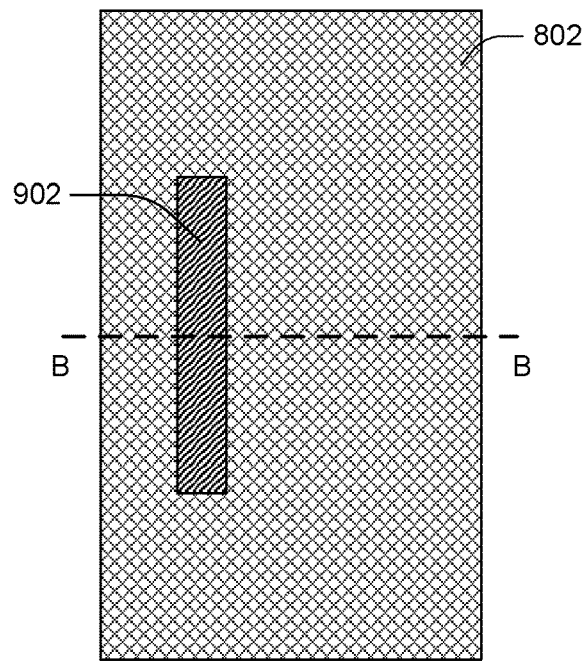
FIGS. 9A-9B illustrate a semiconductor device at a stage of fabrication, in accordance with some embodiments.
Figure 9B:
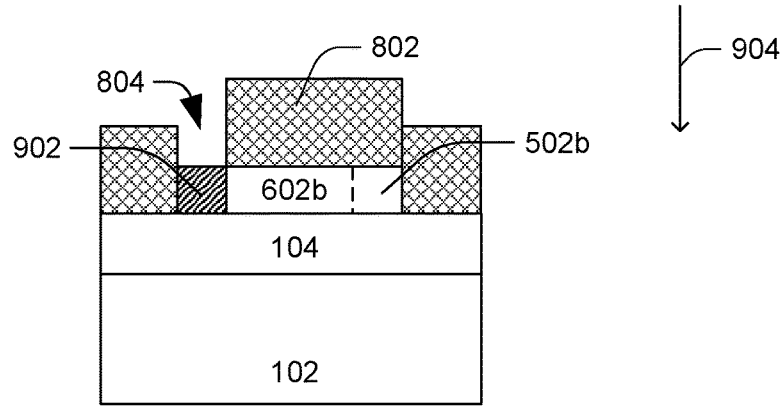

FIGS. 9A and 9B illustrate use of the second patterned photoresist 802 to dope the first portion 502a of the patterned semiconductor layer 502 to form a first n-doped semiconductor structure 902, according to some embodiments. The first portion 502a of the patterned semiconductor layer 502 is doped to form the first n-doped semiconductor structure 902 by at least one of ion implantation, molecular diffusion, or other suitable techniques. In some embodiments, a depth of dopants in the first portion 502a of the patterned semiconductor layer 502 is controlled by increasing or decreasing a voltage used to direct the dopants into the first portion 502a of the patterned semiconductor layer 502. Other processes and/or techniques for at least one of doping the first portion 502a of the patterned semiconductor layer 502 or forming the first n-doped semiconductor structure 902 are within the scope of the present disclosure. In some embodiments, the first n-doped semiconductor structure 902 has a gradient such that a concentration of dopants changes, such as increases or decreases in a direction 904. In some embodiments, the first n-doped semiconductor structure 902 comprises n-type dopants. Other configurations of the first n-doped semiconductor structure 902 are within the scope of the present disclosure.

Figure 10A:
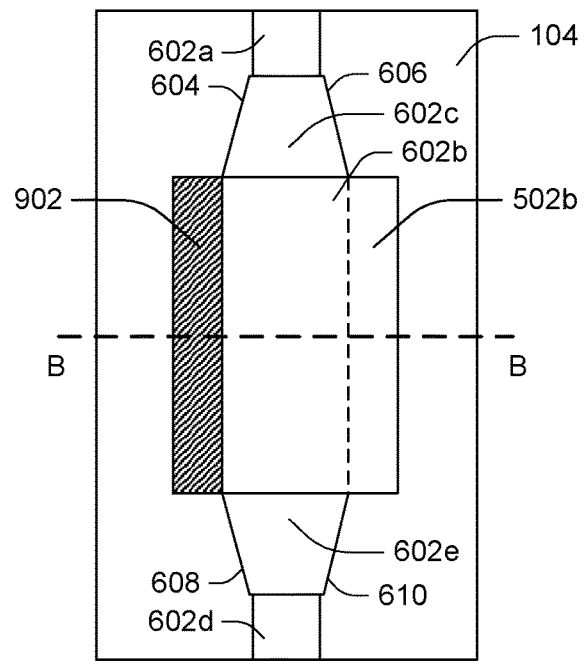
FIGS. 10A-10B illustrate a semiconductor device at a stage of fabrication, in accordance with some embodiments.
Figure 10B:
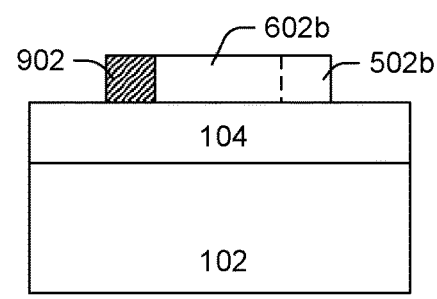

FIGS. 10A and 10B illustrate removal of the second patterned photoresist 802, according to some embodiments. The second patterned photoresist 802 is removed after the first portion 502a of the patterned semiconductor layer 502 is doped to form the first n-doped semiconductor structure 902. The second patterned photoresist 802 is removed by at least one of CMP, etching, or other suitable techniques. According to some embodiments, the second patterned photoresist 802 is at least one of stripped or washed away using at least one of HF, diluted HF, a chlorine compound such as $HCl_2$, $H_2S$, or other suitable material.

Figure 11A:
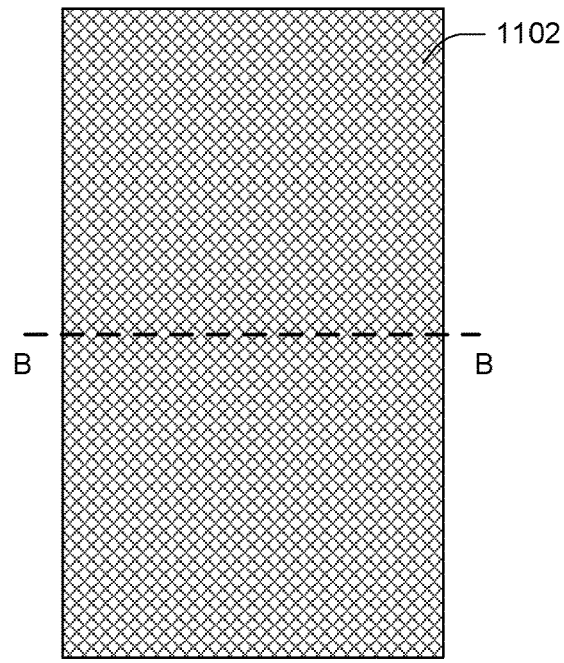
FIGS. 11A-11B illustrate a semiconductor device at a stage of fabrication, in accordance with some embodiments.
Figure 11B:
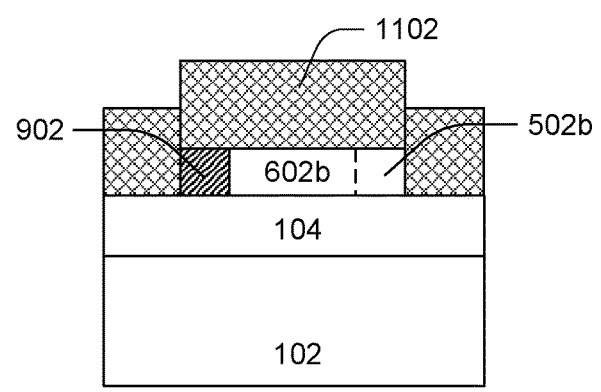

FIGS. 11A and 11B illustrate a third photoresist 1102 formed over at least one of the waveguide 602, the first n-doped semiconductor structure 902, the second portion 502b of the patterned semiconductor layer 502, the first dielectric layer 104 or the substrate 102, according to some embodiments. The third photoresist 1102 overlies at least one of the waveguide 602, the second portion 502b of the patterned semiconductor layer 502, the first dielectric layer 104, or the first n-doped semiconductor structure 902. The third photoresist 1102 is formed by at least one of PVD, sputtering, CVD, LPCVD, ALCVD, UHVCVD, RPCVD, ALD, MBE, LPE, spin on, growth, or other suitable techniques.

Figure 12A:
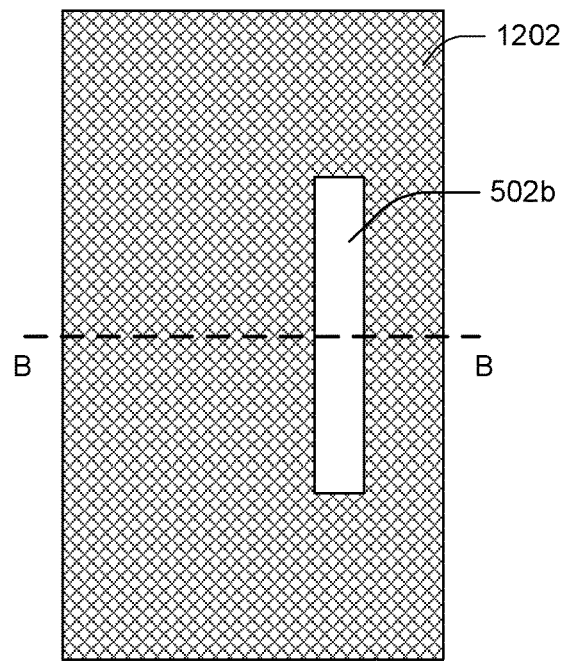
FIGS. 12A-12B illustrate a semiconductor device at a stage of fabrication, in accordance with some embodiments.
Figure 12B:
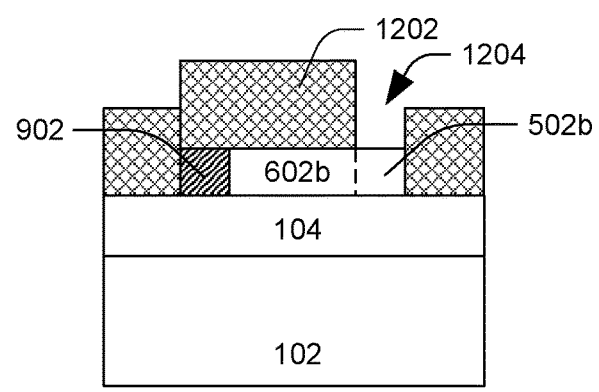

FIGS. 12A and 12B illustrate a third patterned photoresist 1202 formed from the third photoresist 1102, according to some embodiments. The third patterned photoresist 1202 defines an opening 1204 exposing the second portion 502b of the patterned semiconductor layer 502.

Figure 13A:
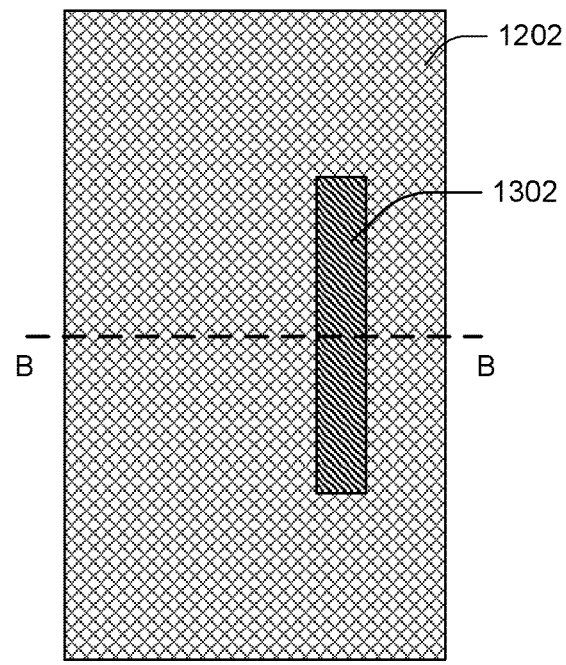
FIGS. 13A-13B illustrate a semiconductor device at a stage of fabrication, in accordance with some embodiments.
Figure 13B:
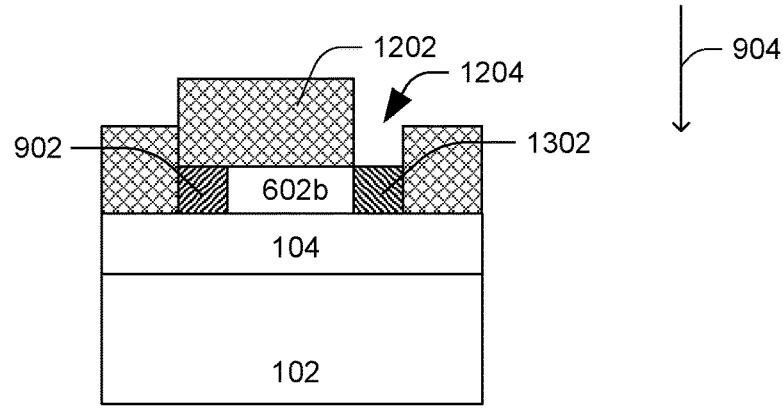

FIGS. 13A and 13B illustrate use of the third patterned photoresist 1202 to dope the second portion 502b of the patterned semiconductor layer 502 to form a first p-doped semiconductor structure 1302, according to some embodiments. The second portion 502b of the patterned semiconductor layer 502 is doped to form the first p-doped semiconductor structure 1302 by at least one of ion implantation, molecular diffusion, or other suitable techniques. In some embodiments, a depth of dopants in the second portion 502b of the patterned semiconductor layer 502 is controlled by increasing or decreasing a voltage used to direct the dopants into the second portion 502b of the patterned semiconductor layer 502. Other processes and/or techniques for at least one of doping the second portion 502b of the patterned semiconductor layer 502 or forming the first p-doped semiconductor structure 1302 are within the scope of the present disclosure. In some embodiments, the first p-doped semiconductor structure 1302 has a gradient such that a concentration of dopants changes, such as increases or decreases in the direction 904. In some embodiments, the first p-doped semiconductor structure 1302 comprises p-type dopants. Other configurations of the first p-doped semiconductor structure 1302 are within the scope of the present disclosure.

Figure 14A:
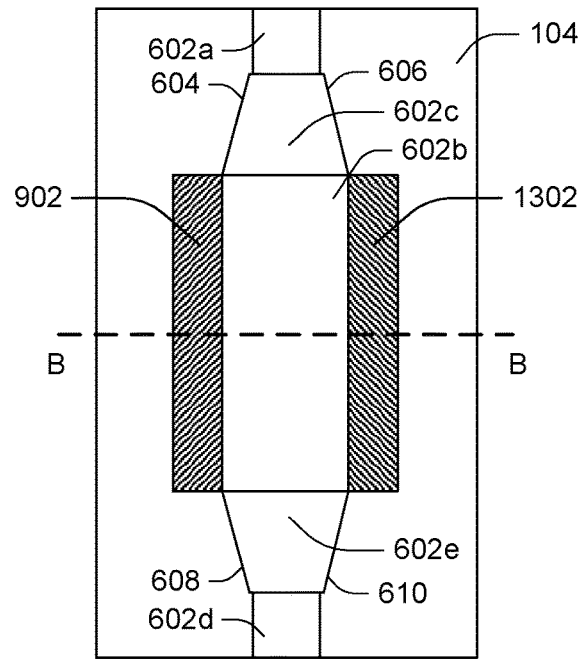
FIGS. 14A-14B illustrate a semiconductor device at a stage of fabrication, in accordance with some embodiments.
Figure 14B:
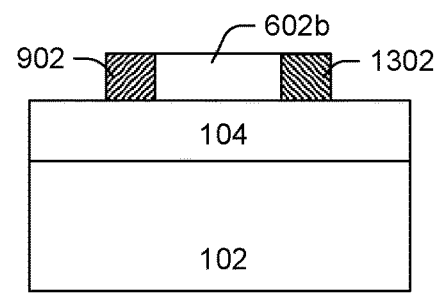

FIGS. 14A and 14B illustrate removal of the third patterned photoresist 1202, according to some embodiments. The third patterned photoresist 1202 is removed after the second portion 502b of the patterned semiconductor layer 502 is doped to form the first p-doped semiconductor structure 1302. The third patterned photoresist 1202 is removed by at least one of CMP, etching, or other suitable techniques. According to some embodiments, the third patterned photoresist 1202 is at least one of stripped or washed away using at least one of HF, diluted HF, a chlorine compound such as $HCl_2$, $H_2S$, or other suitable material.

Figure 15A:
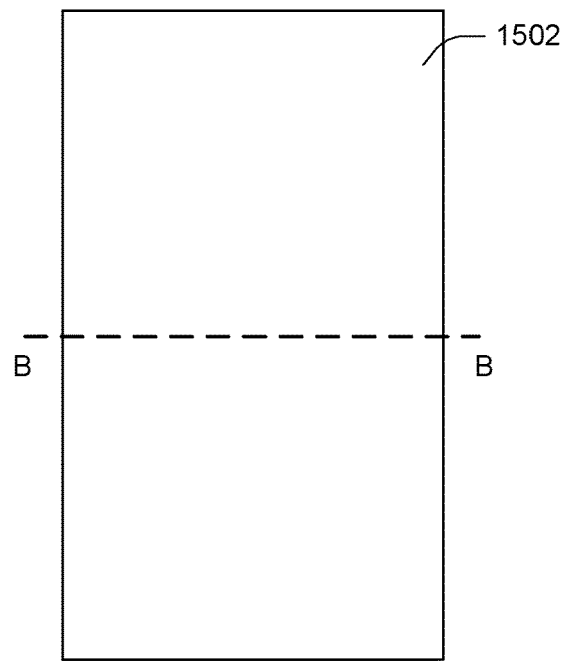
FIGS. 15A-15B illustrate a semiconductor device at a stage of fabrication, in accordance with some embodiments.
Figure 15B:
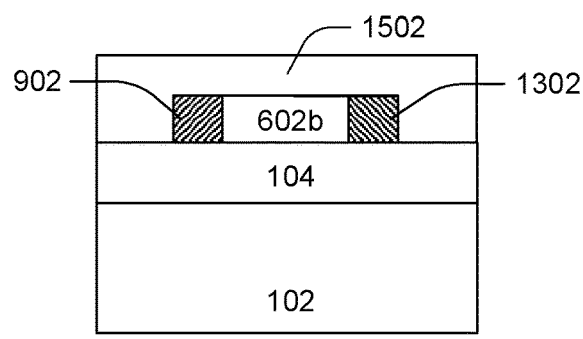

FIGS. 15A and 15B illustrate a second dielectric layer 1502 formed over the first dielectric layer 104, according to some embodiments. The second dielectric layer 1502 comprises at least one of silicon, nitride, oxide, such as $SiO_2$, or other suitable material. The second dielectric layer 1502 is formed by at least one of PVD, sputtering, CVD, LPCVD, ALCVD, UHVCVD, RPCVD, ALD, MBE, LPE, spin on, growth, or other suitable techniques.

In some embodiments, the second dielectric layer 1502 is in direct contact with a top surface of the first dielectric layer 104. The second dielectric layer 1502 is different than the first dielectric layer 104, such as having a different material composition, such that an interface is defined between the second dielectric layer 1502 and the first dielectric layer 104. In some embodiments, the second dielectric layer 1502 does not have a material composition different than the first dielectric layer 104. An interface is nevertheless defined between the second dielectric layer 1502 and the first dielectric layer 104 because the second dielectric layer 1502 and the first dielectric layer 104 are separate, different, etc. layers. In some embodiments, the second dielectric layer 1502 is in indirect contact with the top surface of the first dielectric layer 104, where one or more layers, such as a buffer layer, are between the second dielectric layer 1502 and the first dielectric layer 104.

The second dielectric layer 1502 at least one of overlies the waveguide 602, is in direct contact with a top surface of the waveguide 602, or is in indirect contact with the top surface of the waveguide 602. The second dielectric layer 1502 at least one of overlies the first n-doped semiconductor structure 902, is in direct contact with a top surface of the first n-doped semiconductor structure 902, or is in indirect contact with the top surface of the first n-doped semiconductor structure 902. The second dielectric layer 1502 at least one of overlies the first p-doped semiconductor structure 1302, is in direct contact with a top surface of the first p-doped semiconductor structure 1302, or is in indirect contact with the top surface of the first p-doped semiconductor structure 1302. In some embodiments, one or more layers, such as a buffer layer, are between the second dielectric layer 1502 and at least one of the waveguide 602, the first n-doped semiconductor structure 902, or the first p-doped semiconductor structure 1302.

In some embodiments, an optical signal is propagated via at least some of the waveguide 602 of the semiconductor device 100. In some embodiments, the waveguide 602 is surrounded by material, such as portions of at least one of the first dielectric layer 104 or the second dielectric layer 1502, having a refractive index less than a refractive index of the waveguide 602. In some embodiments, such as where at least one of the first dielectric layer 104 or the second dielectric layer 1502 comprise $SiO_2$, the refractive index of the material surrounding the waveguide 602 is between about 1.4 and about 1.6. In some embodiments, such as where the waveguide 602 is a silicon waveguide, the refractive index of the waveguide 602 is between about 3.3 and about 3.7. In some embodiments, at least one of the waveguide 602 or the material surrounding the waveguide 602 is configured to guide the optical signal into or through the waveguide 602. In some embodiments, the refractive index of the material surrounding the waveguide 602 being less than the refractive index of the waveguide 602 provides for at least some of the optical signal being reflected by the material surrounding the waveguide 602 such that the optical signal at least one of remains within the waveguide 602 or is inhibited from exiting from the waveguide 602 so as to be propagated via the waveguide 602. In some embodiments, the optical signal is propagated in the direction 618. In some embodiments, the optical signal is propagated in a direction different than, such as opposite, the direction 618.

In some embodiments, at least one of the second portion 602b of the waveguide 602, the first n-doped semiconductor structure 902, or the first p-doped semiconductor structure 1302 of the semiconductor device 100 form a modulation structure, such as a PIN modulation structure comprising a p-type region comprising the first p-doped semiconductor structure 1302, an n-type region comprising the first n-doped semiconductor structure 902 and an intrinsic region comprising the second portion 602b of the waveguide 602. In some embodiments, the modulation structure comprises at least one of a Variable Optical Alternator (VOA) structure, a Variable Power Alternator structure, a Low Speed PIN (LSPIN) modulation structure, or other structure. At least one of a material absorption or a refractive index of the second portion 602b of the waveguide 602 depends upon a free carrier concentration of the second portion 602b of the waveguide 602. In some embodiments, the modulation structure is used to modulate the optical signal, such as by applying a forward bias to the modulation structure to at least one of effect, such as increase, the free carrier concentration of the second portion 602b of the waveguide 602, or inject at least one of current or free carriers into the second portion 602b of the waveguide 602. At least one of a phase or a power of the optical signal are at least one of controlled or modulated using the modulation structure, such as by controlling a voltage of the forward bias applied to the modulation structure. In some embodiments, application of the forward bias comprises application of at least one of a first voltage, such as a positive voltage, to the first p-doped semiconductor structure 1302, or a second voltage, such as a negative voltage or ground, to the first n-doped semiconductor structure 902. In some embodiments, power applied to the modulation structure is operated, such as switched on and off, at a first operating frequency. In some embodiments, at least one of the free carrier concentration or the current injected into the second portion 602b of the waveguide 602 depend upon at least one of a depth of dopants, such as n-type dopants, in the first n-doped semiconductor structure 902, or a depth of dopants, such as p-type dopants, in the first p-doped semiconductor structure 1302. In some embodiments, at least one of the depth of dopants in the first n-doped semiconductor structure 902 or the depth of dopants in the first p-doped semiconductor structure 1302 are based upon at least one of a desired free carrier concentration of the second portion 602b of the waveguide 602, a desired current through the second portion 602b of the waveguide 602, a desired phase shift of the optical signal, a desired change in power of the optical signal, or other suitable parameter associated with the modulation structure. In some embodiments, at least one of a current through the second portion 602b of the waveguide 602, the first voltage, the second voltage, or the first operating frequency are based upon at least one of the desired phase shift of the optical signal, the desired change in power of the optical signal, or other suitable parameter associated with the modulation structure.

Implementing the second portion 602b of the waveguide 602 to have the second width 614 provides for lower signal loss of the optical signal as compared with some semiconductor structures that comprise a structure comprising a portion of a waveguide between a p-type semiconductor structure and an n-type semiconductor structure, wherein a width of the portion of the waveguide is at least one of smaller than the second width 614 of the second portion 602b of the waveguide 602 or smaller than or equal to the first width 612 of the first portion 602a of the waveguide 602. In some embodiments, the lower signal loss of the optical signal is a result of the larger width of the second portion 602b of the waveguide 602, wherein the larger width of the second portion 602b of the waveguide 602 results in one or more properties of the modulation structure causing no signal loss or reduced signal loss of the optical signal as compared to the aforementioned semiconductor structures. In some embodiments, the one or more properties comprise at least one of free carriers in the second portion 602b of the waveguide 602, current injected into the second portion 602b of the waveguide 602, the forward bias, or other property. In some embodiments, a signal loss of the optical signal in the second portion 602b of the waveguide 602 is about −171.7 decibels per centimeter if a width of the second portion 602b of the waveguide 602 is less than the second width 614 between about 30,000 angstroms to about 150,000 angstroms, such as if the width of the second portion 602b is about 10,000 angstroms. In some embodiments, a signal loss of the optical signal in the second portion 602b of the waveguide 602 is between about −42.8 decibels per centimeter to about −0.4 decibels per centimeter if the second portion 602b of the waveguide 602b has the second width 614 between about 30,000 angstroms to about 120,000 angstroms, such as about −1.1 decibels per centimeter if the second width 614 is about 10,000 angstroms.

In some embodiments, at least one of the waveguide 602, the first portion 602a of the waveguide 602, or the fourth portion 602d of the waveguide 602 are configured to propagate the optical signal having a single mode, such as a fundamental mode. In some embodiments, implementing at least one of the third portion 602c or the fifth portion 602e of the waveguide 602 to have at least one of tapered sidewalls 604, 606, 608, or 610 at least one of provides for excitement of the single mode or inhibits formation of one or more modes of the optical signal, such as one or more modes other than the single mode, wherein the one or more modes may otherwise form without at least one of the third portion 602c or the fifth portion 602e of the waveguide 602 having at least one of tapered sidewalls 604, 606, 608, or 610. In some embodiments, implementing at least one of the third portion 602c or the fifth portion 602e of the waveguide 602 to have at least one of tapered sidewalls 604, 606, 608, or 610 inhibits loss of the optical signal, that may otherwise occur without at least one of the third portion 602c of the waveguide 602 between the first portion 602a and the second portion 602b of the waveguide 602 or the fifth portion 602e of the waveguide 602 between the fourth portion 602d and the second portion 602b of the waveguide 602, such as a result of light escaping the waveguide 602 due to at least one of a size difference between the first portion 602a and the second portion 602b of the waveguide 602 or a size difference between the fourth portion 602d and the second portion 602b of the waveguide 602.

FIGS. 16A-24B illustrate a semiconductor device 1600 at various stages of fabrication, in accordance with some embodiments. FIGS. 16A, 17A, 18A, 19A, 20A, 21A, 22A, 23A, and 24A illustrate top views of the semiconductor device 1600 at various stages of fabrication. FIGS. 16B, 17B, 18B, 19B, 20B, 21B, 22B, 23B, and 24B illustrate cross-sectional views of the semiconductor device 1600 taken along lines B-B of FIGS. 16A, 17A, 18A, 19A, 20A, 21A, 22A, 23A, and 24A, respectively.

In some embodiments, the semiconductor device 1600 comprises at least one of a communication device, a receiver, a transmitter, a transceiver, a photonic device, a silicon-based photonic IC, or a different type of device. The semiconductor device 1600 is configured for at least one of optical communication or propagation of an optical signal. Other structures and/or configurations of the semiconductor device 1600 are within the scope of the present disclosure.

In some embodiments, the semiconductor device 1600 comprises at least some elements, structures, layers, features, etc. of the semiconductor device 100, such as at least one of the substrate 102, the first dielectric layer 104, the waveguide 602, the first n-doped semiconductor structure 902, or the first p-doped semiconductor structure 1302. In some embodiments, one or more techniques used to form the semiconductor device 100, such as one or more techniques shown in and/or described with respect to FIGS. 1A-15B, may be used to form the semiconductor device 1600.

Figure 16A:
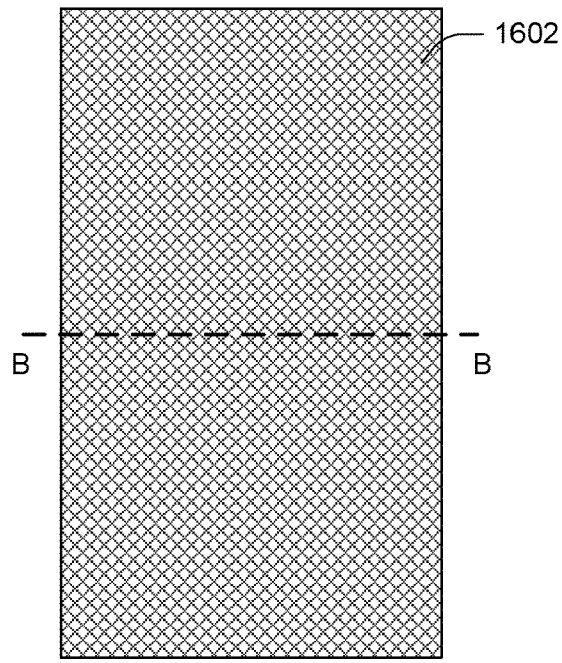
FIGS. 16A-16B illustrate a semiconductor device at a stage of fabrication, in accordance with some embodiments.
Figure 16B:
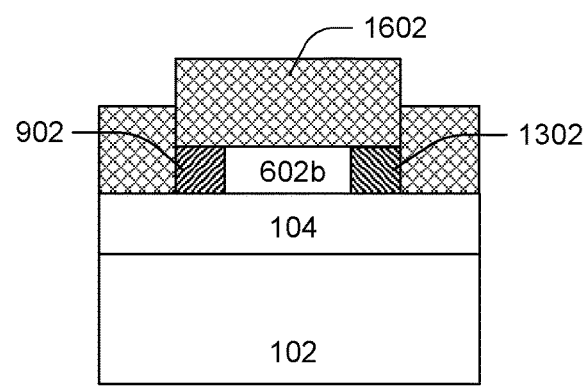

FIGS. 16A and 16B illustrate a fourth photoresist 1602 formed over at least one of the waveguide 602, the first n-doped semiconductor structure 902, the first p-doped semiconductor structure 1302, the first dielectric layer 104 or the substrate 102, according to some embodiments. The fourth photoresist 1602 overlies at least one of the waveguide 602, the first p-doped semiconductor structure 1302, the first n-doped semiconductor structure 902, or the first dielectric layer 104. The fourth photoresist 1602 is formed by at least one of PVD, sputtering, CVD, LPCVD, ALCVD, UHVCVD, RPCVD, ALD, MBE, LPE, spin on, growth, or other suitable techniques.

Figure 17A:
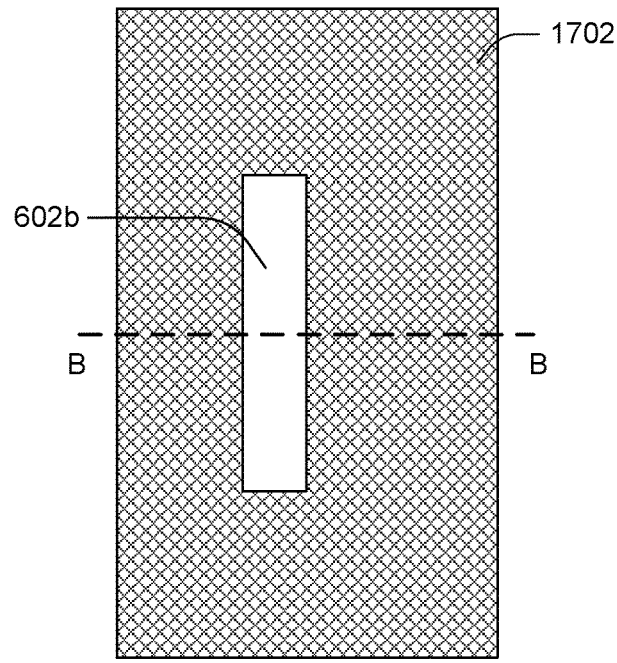
FIGS. 17A-17B illustrate a semiconductor device at a stage of fabrication, in accordance with some embodiments.
Figure 17B:
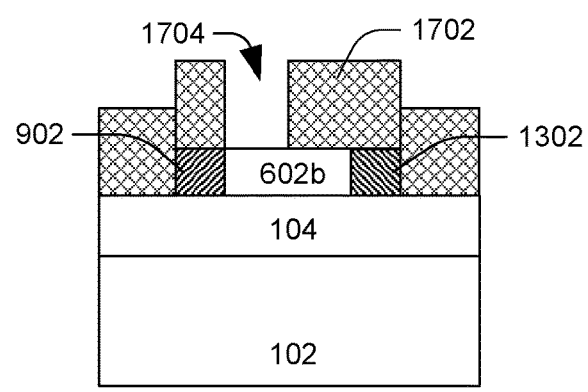

FIGS. 17A and 17B illustrate a fourth patterned photoresist 1702 formed from the fourth photoresist 1602, according to some embodiments. The fourth patterned photoresist 1702 defines an opening 1704 exposing a first sub-portion of the second portion 602b of the waveguide 602.

Figure 18A:
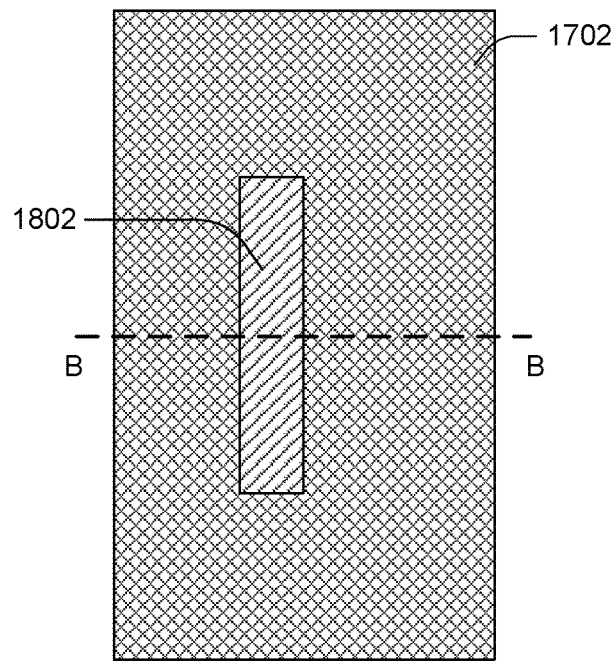
FIGS. 18A-18B illustrate a semiconductor device at a stage of fabrication, in accordance with some embodiments.
Figure 18B:
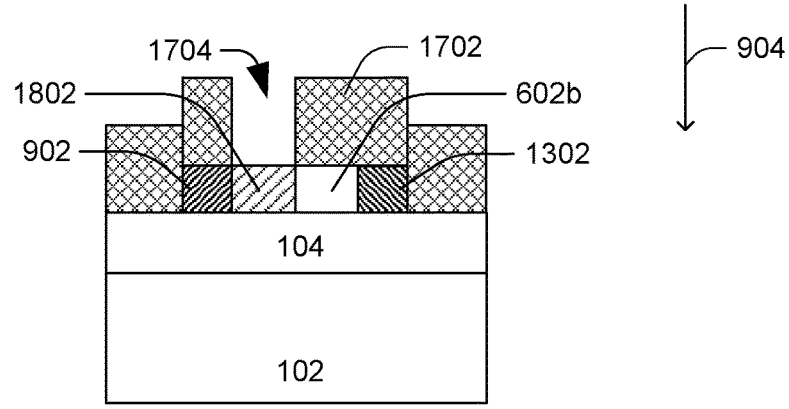

FIGS. 18A and 18B illustrate use of the fourth patterned photoresist 1702 to dope the first sub-portion of the second portion 602b of the waveguide 602 to form a first n-doped region 1802, according to some embodiments. The first sub-portion of the second portion 602b of the waveguide 602 is doped to form the first n-doped region 1802 by at least one of ion implantation, molecular diffusion, or other suitable techniques. In some embodiments, a depth of dopants in the first sub-portion of the second portion 602b of the waveguide 602 is controlled by increasing or decreasing a voltage used to direct the dopants into the first sub-portion of the second portion 602b of the waveguide 602. Other processes and/or techniques for at least one of doping the first sub-portion of the second portion 602b of the waveguide 602 or forming the first n-doped region 1802 are within the scope of the present disclosure. In some embodiments, the first n-doped region 1802 has a gradient such that a concentration of dopants changes, such as increases or decreases in the direction 904. The first n-doped region 1802 is at least one of in contact with or adjacent the first n-doped semiconductor structure 902. In some embodiments, the first n-doped region 1802 comprises n-type dopants. Other configurations of the first n-doped region 1802 are within the scope of the present disclosure.

Figure 19A:
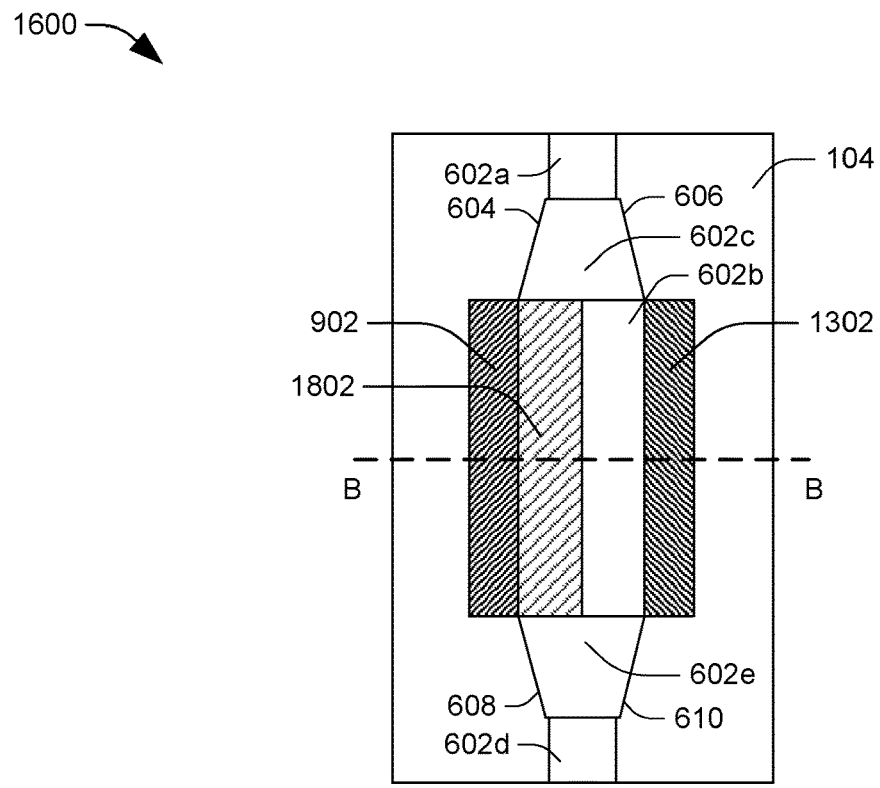
FIGS. 19A-19B illustrate a semiconductor device at a stage of fabrication, in accordance with some embodiments.
Figure 19B:
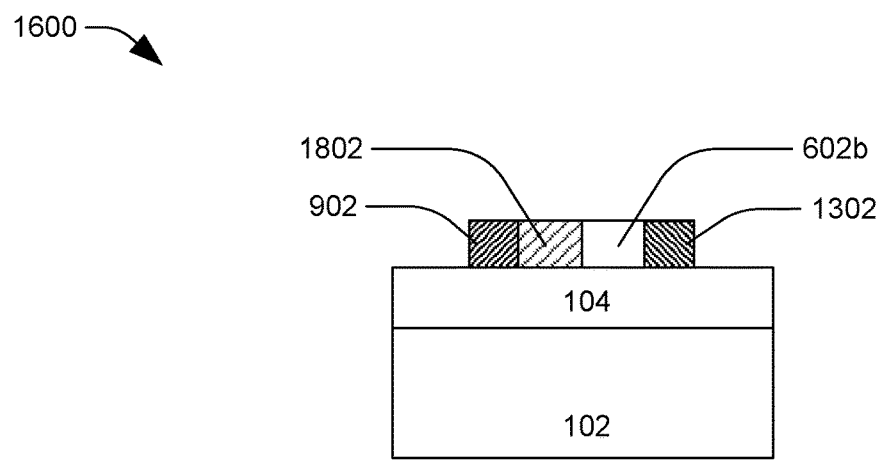

FIGS. 19A and 19B illustrate removal of the fourth patterned photoresist 1702, according to some embodiments. The fourth patterned photoresist 1702 is removed after the first sub-portion of the second portion 602b of the waveguide 602 is doped to form the first n-doped region 1802. The fourth patterned photoresist 1702 is removed by at least one of CMP, etching, or other suitable techniques. According to some embodiments, the fourth patterned photoresist 1702 is at least one of stripped or washed away using at least one of HF, diluted HF, a chlorine compound such as HCl$_2$, H$_2$S, or other suitable material.

Figure 20A:
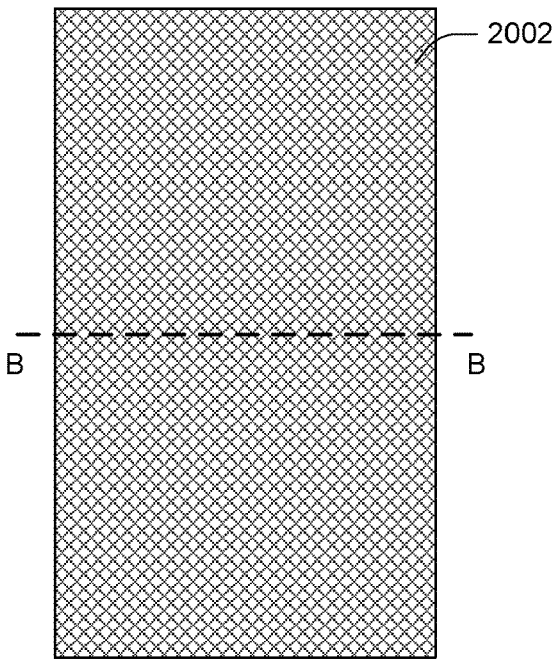
FIGS. 20A-20B illustrate a semiconductor device at a stage of fabrication, in accordance with some embodiments.
Figure 20B:
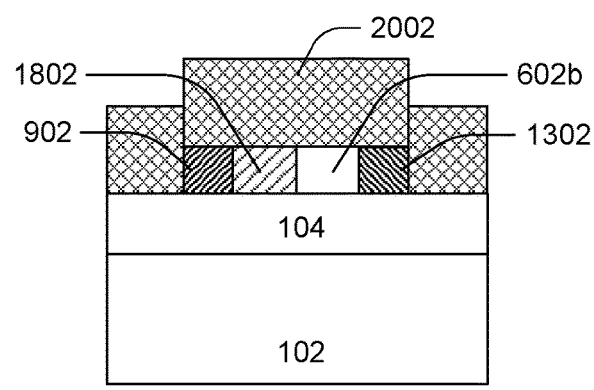

FIGS. 20A and 20B illustrate a fifth photoresist 2002 formed over at least one of the waveguide 602, the first n-doped semiconductor structure 902, the first p-doped semiconductor structure 1302, the first dielectric layer 104 or the substrate 102, according to some embodiments. The fifth photoresist 2002 overlies at least one of the waveguide 602, the first p-doped semiconductor structure 1302, the first n-doped semiconductor structure 902, or the first dielectric layer 104. The fifth photoresist 2002 is formed by at least one of PVD, sputtering, CVD, LPCVD, ALCVD, UHVCVD, RPCVD, ALD, MBE, LPE, spin on, growth, or other suitable techniques.

Figure 21A:
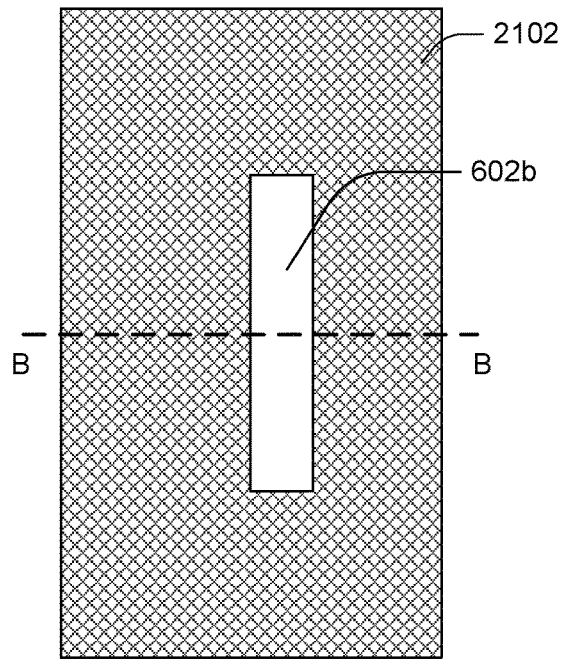
FIGS. 21A-21B illustrate a semiconductor device at a stage of fabrication, in accordance with some embodiments.
Figure 21B:
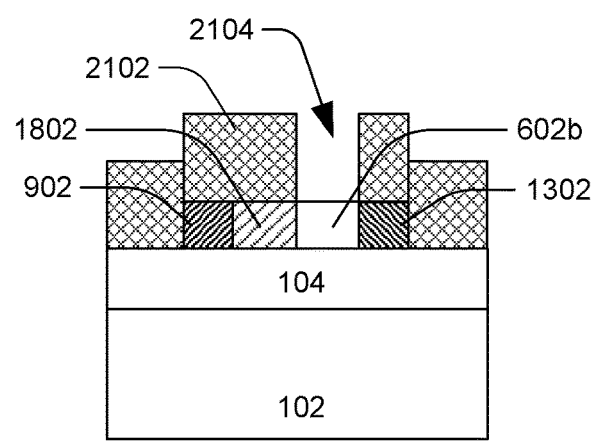

FIGS. 21A and 21B illustrate a fifth patterned photoresist 2102 formed from the fifth photoresist 2002, according to some embodiments. The fifth patterned photoresist 2102 defines an opening 2104 exposing a second sub-portion of the second portion 602b of the waveguide 602.

Figure 22A:
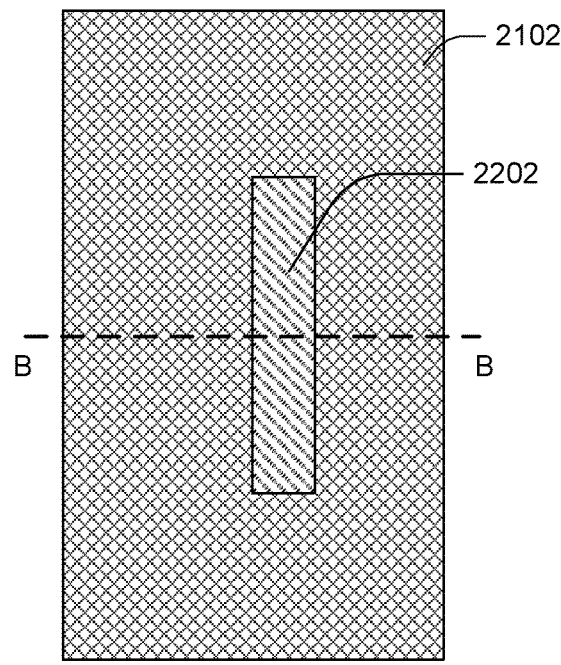
FIGS. 22A-22B illustrate a semiconductor device at a stage of fabrication, in accordance with some embodiments.
Figure 22B:
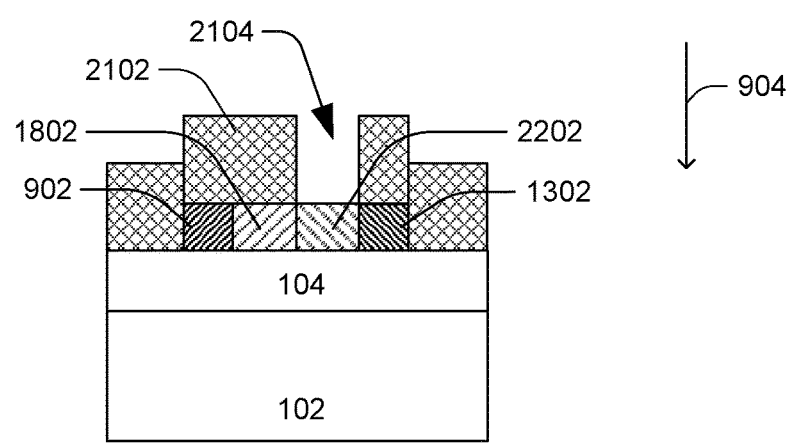

FIGS. 22A and 22B illustrate use of the fifth patterned photoresist 2102 to dope the second sub-portion of the second portion 602b of the waveguide 602 to form a first p-doped region 2202, according to some embodiments. The second sub-portion of the second portion 602b of the waveguide 602 is doped to form the first p-doped region 2202 by at least one of ion implantation, molecular diffusion, or other suitable techniques. In some embodiments, a depth of dopants in the second sub-portion of the second portion 602b of the waveguide 602 is controlled by increasing or decreasing a voltage used to direct the dopants into the second sub-portion of the second portion 602b of the waveguide 602. Other processes and/or techniques for at least one of doping the second sub-portion of the second portion 602b of the waveguide 602 or forming the first p-doped region 2202 are within the scope of the present disclosure. In some embodiments, the first p-doped region 2202 has a gradient such that a concentration of dopants changes, such as increases or decreases in the direction 904. The first p-doped region 2202 is between the first n-doped region 1802 and the first p-doped semiconductor structure 1302. The first p-doped region 2202 is at least one of in contact with or adjacent the first p-doped semiconductor structure 1302. In some embodiments, the first p-doped region 2202 is at least one of in contact with or adjacent the first n-doped region 1802. In some embodiments, the first p-doped region 2202 comprises p-type dopants. Other configurations of the first p-doped region 2202 are within the scope of the present disclosure.

In some embodiments, a first dopant concentration of the first n-doped region 1802, such as a concentration of n-type dopants in the first n-doped region 1802, is lower than a second dopant concentration of the first n-doped semiconductor structure 902, such as a concentration of n-type dopants in the first n-doped semiconductor structure 902. In some embodiments, a third dopant concentration of the first p-doped region 2202, such as a concentration of p-type dopants in the first p-doped region 2202, is lower than a fourth dopant concentration of the first p-doped semiconductor structure 1302, such as a concentration of p-type dopants in the first p-doped semiconductor structure 1302.

Figure 23A:
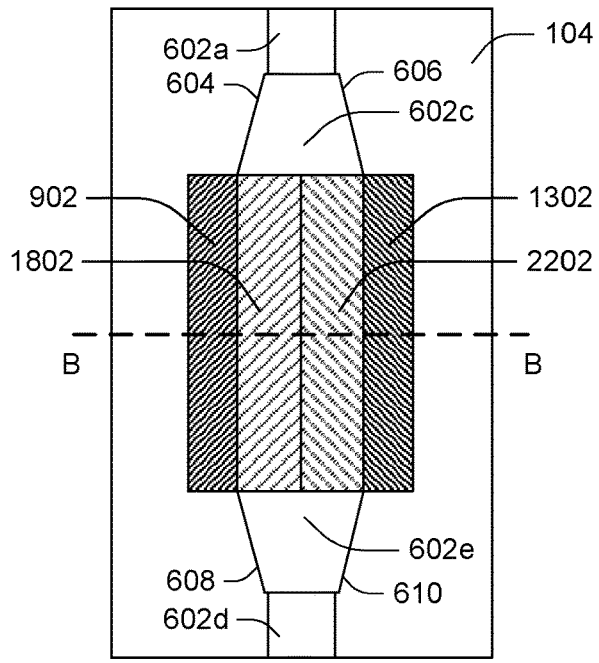
FIGS. 23A-23B illustrate a semiconductor device at a stage of fabrication, in accordance with some embodiments.
Figure 23B:
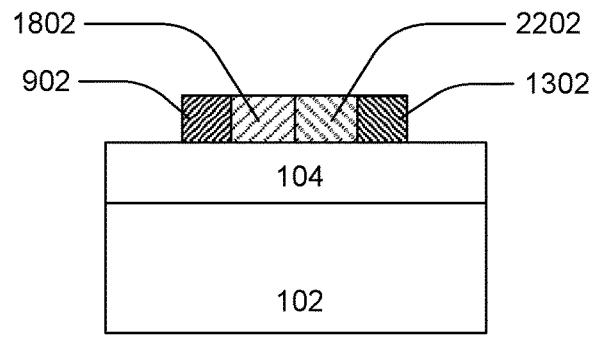

FIGS. 23A and 23B illustrate removal of the fifth patterned photoresist 2102, according to some embodiments. The fifth patterned photoresist 2102 is removed after the second sub-portion of the second portion 602b of the waveguide 602 is doped to form the first p-doped region 2202. The fifth patterned photoresist 2102 is removed by at least one of CMP, etching, or other suitable techniques. According to some embodiments, the fifth patterned photoresist 2102 is at least one of stripped or washed away using at least one of HF, diluted HF, a chlorine compound such as HCl$_2$, H$_2$S, or other suitable material.

Figure 24A:
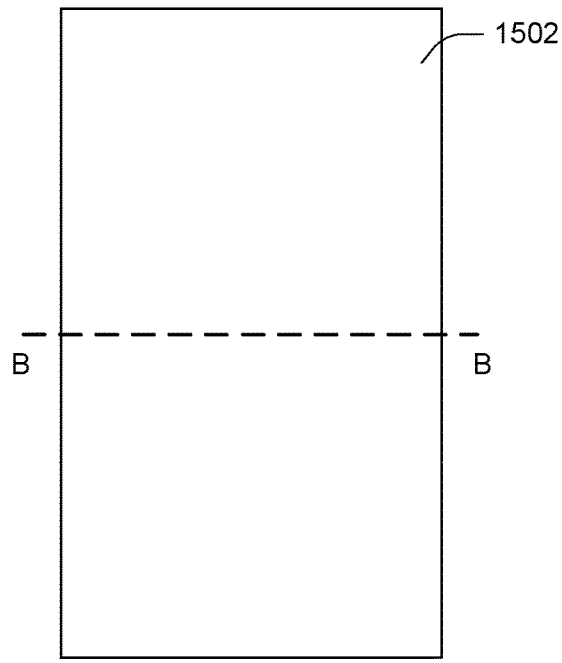
FIGS. 24A-24B illustrate a semiconductor device at a stage of fabrication, in accordance with some embodiments.
Figure 24B:
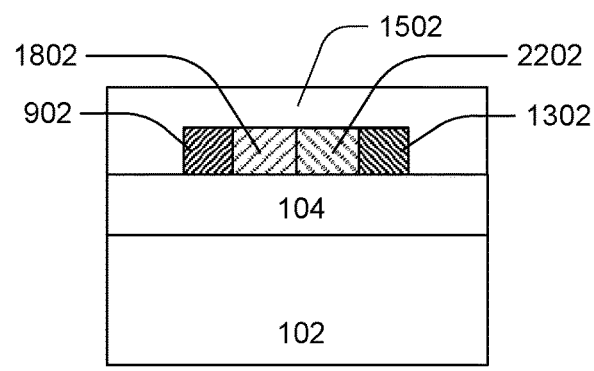

FIGS. 24A and 24B illustrate the second dielectric layer 1502 formed over the waveguide 602, the first n-doped semiconductor structure 902, the first p-doped semiconductor structure 1302, and the first dielectric layer 104, according to some embodiments.

Figure 25:
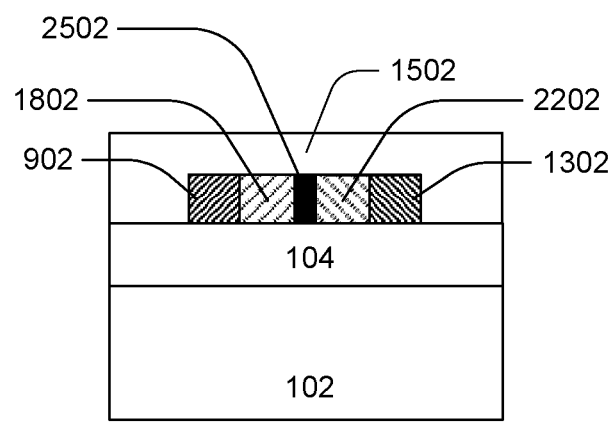
FIG. 25 illustrates a semiconductor device, in accordance with some embodiments.

In some embodiments, the second portion 602b of the waveguide 602 comprises a depletion region 2502. FIG. 25 illustrates the semiconductor device 1600 according to some embodiments in which the second portion 602b of the waveguide 602 comprises the depletion region 2502. In some embodiments, the depletion region 2502 is between the first p-doped region 2202 and the first n-doped region 1802. Other configurations of the depletion region 2502 are within the scope of the present disclosure.

In some embodiments, an optical signal is propagated via at least some of the waveguide 602 of the semiconductor device 1600. In some embodiments, the waveguide 602 is surrounded by material, such as portions of at least one of the first dielectric layer 104 or the second dielectric layer 1502, having a refractive index less than a refractive index of the waveguide 602. In some embodiments, at least one of the waveguide 602 or the material surrounding the waveguide 602 is configured to guide the optical signal into or through the waveguide 602. In some embodiments, the refractive index of the material surrounding the waveguide 602 being less than the refractive index of the waveguide 602 provides for at least some of the optical signal being reflected by the material surrounding the waveguide 602 such that the optical signal at least one of remains within the waveguide 602 or is inhibited from exiting from the waveguide 602 so as to be propagated via the waveguide 602.

In some embodiments, at least one of the second portion 602b of the waveguide 602, the first n-doped semiconductor structure 902, or the first p-doped semiconductor structure 1302 of the semiconductor device 1600 form a phase shifter structure, such as a PN phase shifter structure, a PN depletion phase shifter, or an optical modulator structure. In some embodiments, the phase shifter structure is used to provide a phase shift of the optical signal, such as by controlling a voltage applied to the phase shifter structure to at least one of apply a reverse bias to the phase shifter structure or change a size of the depletion region 2502. In some embodiments, application of the reverse bias comprises application of at least one of a third voltage, such as a negative voltage or ground, to the first p-doped semiconductor structure 1302, or a fourth voltage, such as a positive voltage, to the first n-doped semiconductor structure 902. In some embodiments, power applied to the phase shifter structure is operated, such as switched on and off, at a second operating frequency. In some embodiments, the second operating frequency is higher than the first operating frequency. In some embodiments, at least one of a free carrier concentration of the second portion 602b of the waveguide 602 depends upon at least one of a depth of dopants, such as n-type dopants, in the first n-doped semiconductor structure 902, or a depth of dopants, such as p-type dopants, in the first p-doped semiconductor structure 1302. In some embodiments, at least one of the depth of dopants in the first n-doped semiconductor structure 902 or the depth of dopants in the first p-doped semiconductor structure 1302 are based upon at least one of a desired free carrier concentration of the second portion 602b of the waveguide 602, a desired phase shift of the optical signal, or other suitable parameter associated with the phase shifter structure. In some embodiments, at least one of a current through the second portion 602b of the waveguide 602, the third voltage, the fourth voltage, or the second operating frequency are based upon at least one of the desired phase shift of the optical signal, or other suitable parameter associated with the phase shifter structure.

Implementing the second portion 602b of the waveguide 602 to have the second width 614 provides for lower signal loss of the optical signal as compared with some semiconductor structures that comprise a structure comprising a portion of a waveguide between a p-type semiconductor structure and an n-type semiconductor structure, wherein a width of the portion of the waveguide is at least one of smaller than the second width 614 of the second portion 602b of the waveguide 602 or smaller than or equal to the first width 612 of the first portion 602a of the waveguide 602. In some embodiments, the lower signal loss of the optical signal is a result of the larger width of the second portion 602b of the waveguide 602, wherein the larger width of the second portion 602b of the waveguide 602 results in one or more properties of the phase shifter structure causing no signal loss or reduced signal loss of the optical signal as compared to the aforementioned semiconductor structures. In some embodiments, the one or more properties comprise at least one of free carriers in the second portion 602b of the waveguide 602, the reverse bias, or other property.

In some embodiments, at least one of the waveguide 602, the first portion 602a of the waveguide 602, or the fourth portion 602d of the waveguide 602 are configured to propagate the optical signal having a single mode, such as a fundamental mode. In some embodiments, implementing at least one of the third portion 602c or the fifth portion 602e of the waveguide 602 to have at least one of tapered sidewalls 604, 606, 608, or 610 at least one of provides for excitement of the single mode or inhibits formation of one or more modes of the optical signal, such as one or more modes other than the single mode, wherein the one or more modes may otherwise form without at least one of the third portion 602c or the fifth portion 602e of the waveguide 602 having at least one of tapered sidewalls 604, 606, 608, or 610. In some embodiments, implementing at least one of the third portion 602c or the fifth portion 602e of the waveguide 602 to have at least one of tapered sidewalls 604, 606, 608, or 610 inhibits loss of the optical signal, that may otherwise occur without at least one of the third portion 602c of the waveguide 602 between the first portion 602a and the second portion 602b of the waveguide 602 or the fifth portion 602e of the waveguide 602 between the fourth portion 602d and the second portion 602b of the waveguide 602, such as a result of light escaping the waveguide 602 due to at least one of a size difference between the first portion 602a and the second portion 602b of the waveguide 602 or a size difference between the fourth portion 602d and the second portion 602b of the waveguide 602.

Figure 26:
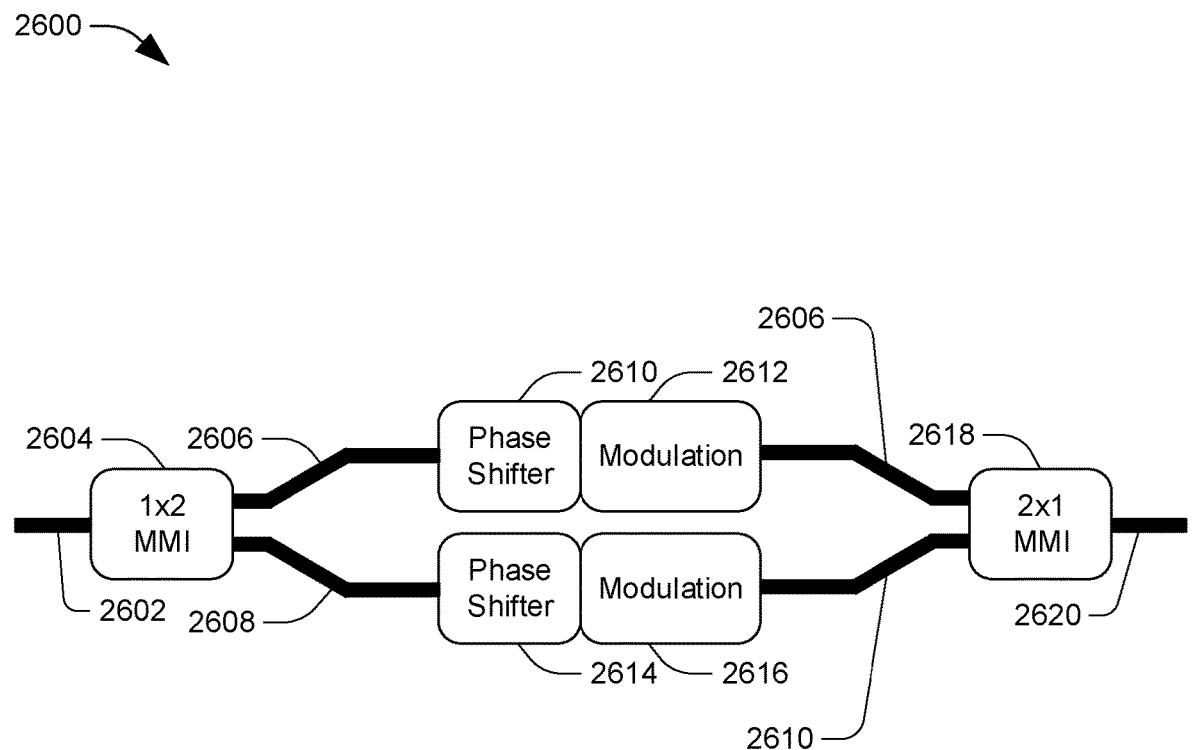
FIG. 26 illustrates a semiconductor device, in accordance with some embodiments.

FIG. 26 illustrates a semiconductor device 2600, according to some embodiments. The semiconductor device 2600 comprises a communication device, such as at least one of a receiver, a transmitter, a transceiver, etc. In some embodiments, a first optical signal is propagated via a first waveguide 2602 to a 1×2 multi-mode interferometer (MMI) 2604. The 1×2 MMI 2604 splits the first optical signal to a second optical signal propagated via a second waveguide 2606, such as the waveguide 602, and a third optical signal propagated via a third waveguide 2608, such as the waveguide 602. The second optical signal is propagated via the second waveguide 2606 to at least one of a first phase shifter structure 2610, such as the phase shifter structure of the semiconductor device 1600, or a first modulation structure 2612, such as the modulation structure of the semiconductor device 100. The third optical signal is propagated via the third waveguide 2608 to at least one of a second phase shifter structure 2614, such as the phase shifter structure of the semiconductor device 1600, or a second modulation structure 2616, such as the modulation structure of the semiconductor device 100. In some embodiments, at least one of the second waveguide 2606 or the third waveguide 2608 have a bend (such as shown in FIG. 26) such that a distance between at least one of the first phase shifter structure 2610 or the first modulation structure 2612 and at least one of the second phase shifter structure 2614 or the second modulation structure 2616 exceeds a threshold distance.

At least one of the first phase shifter structure 2610 or the first modulation structure 2612 output a fourth optical signal propagated via the second waveguide 2606 to a 2×1 MMI 2618. In some embodiments, at least one of the first phase shifter structure 2610 or the first modulation structure 2612 provide for at least one of a phase shift, a power reduction, etc. of the second optical signal such that the fourth optical signal has at least one of a phase difference, a power difference, etc. with the second optical signal. In some embodiments, at least one of the second phase shifter structure 2614 or the second modulation structure 2616 output a fifth optical signal propagated via the third waveguide 2608 to the 2×1 MMI 2618. In some embodiments, at least one of the second phase shifter structure 2614 or the second modulation structure 2616 provide for at least one of a phase shift, a power reduction, etc. of the third optical signal such that the fifth optical signal has at least one of a phase difference, a power difference, etc. with the third optical signal. In some embodiments, the 2×1 MMI 2618 is configured to combine the fourth optical signal and the fifth optical signal to a sixth optical signal propagated via a sixth waveguide 2620. In some embodiments, the sixth optical signal has one or more differences with the first optical signal, such as at least one of an amplitude difference, a power difference, a phase difference, or other difference. Embodiments are contemplated in which the at least one of the 1×2 MMI 2604 is replaced with a 1×2 directional coupler (DC) or the 2×1 MMI 2618 is replaced with a 2×1 DC.

According to some embodiments, at least one of the one or more layers, features, structures, elements, etc. disclosed herein are in direct contact with another of the one or more layers, features, structures, elements, etc. disclosed herein. According to some embodiments, at least one of the one or more layers, features, structures, elements, etc. disclosed herein are not in direct contact with another of the one or more layers, features, structures, elements, etc. disclosed herein, such as where one or more intervening, separating, etc. layers, features, structures, elements, etc. exist.

In some embodiments, a semiconductor device is provided. The semiconductor device includes a waveguide over a first dielectric layer. A first portion of the waveguide has a first width. A second portion of the waveguide has a second width larger than the first width. The semiconductor device includes a first doped semiconductor structure. The semiconductor device includes a second doped semiconductor structure. The second portion of the waveguide is between the first doped semiconductor structure and the second doped semiconductor structure.

In some embodiments, a method for forming a semiconductor device is provided. The method includes forming a semiconductor layer over a first dielectric layer. The method includes patterning the semiconductor layer to form a patterned semiconductor layer including a waveguide. The waveguide includes a first portion having a first width and a second portion having a second width larger than the first width. The second portion of the waveguide is between a first portion of the patterned semiconductor layer and a second portion of the patterned semiconductor layer. The method includes doping the first portion of the patterned semiconductor layer to form an n-doped semiconductor structure adjacent the second portion of the waveguide. The method includes doping the second portion of the patterned semiconductor layer to form a p-doped semiconductor structure adjacent the second portion of the waveguide.

In some embodiments, a semiconductor device is provided. The semiconductor device includes a waveguide over a first dielectric layer. A first portion of the waveguide has a first width. A second portion of the waveguide has a second width larger than the first width. A third portion of the waveguide extends from the first portion of the waveguide to the second portion of the waveguide. The third portion of the waveguide has a first tapered sidewall extending from a first side of the third portion of the waveguide to a second side of the third portion of the waveguide. The first side of the third portion of the waveguide is adjacent the first portion of the waveguide and the second side of the third portion of the waveguide is adjacent the second portion of the waveguide. The semiconductor device includes an n-doped semiconductor structure and a p-doped semiconductor structure. The second portion of the waveguide is between the n-doped semiconductor structure and the p-doped semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
    a waveguide over a first dielectric layer, wherein:
        a first portion of the waveguide has a constant first width;
        a second portion of the waveguide has a second width larger than the constant first width;
        a third portion of the waveguide has a third width smaller than the second portion; and the second portion is between the first portion and the third portion;
a first doped semiconductor structure; and
a second doped semiconductor structure, wherein the second portion of the waveguide is between the first doped semiconductor structure and the second doped semiconductor structure.

2. The semiconductor device of claim 1, wherein:
a fourth portion of the waveguide extends from the first portion of the waveguide to the second portion of the waveguide; and
the fourth portion of the waveguide has a first tapered sidewall extending from the first portion of the waveguide to the second portion of the waveguide.

3. The semiconductor device of claim 2, wherein:
the fourth portion of the waveguide has a second tapered sidewall extending from the first portion of the waveguide to the second portion of the waveguide; and
the first tapered sidewall has a first slope and the second tapered sidewall has a second slope; and
the second slope is opposite in polarity relative to the first slope.

4. The semiconductor device of claim 3, wherein:
an absolute value of the second slope is equal to an absolute value of the first slope.

5. The semiconductor device of claim 1, comprising:
a second dielectric layer over the first dielectric layer, wherein:
  a first sidewall of the first doped semiconductor structure is adjacent a first sidewall of the second dielectric layer; and
  a second sidewall of the second doped semiconductor structure is adjacent a second sidewall of the second dielectric layer.

6. The semiconductor device of claim 1, wherein:
the second portion of the waveguide comprises an n-doped region and a p-doped region.

7. The semiconductor device of claim 6, wherein:
the n-doped region of the second portion of the waveguide is adjacent the first doped semiconductor structure; and
the p-doped region of the second portion of the waveguide is adjacent the second doped semiconductor structure.

8. The semiconductor device of claim 7, wherein:
the second portion of the waveguide comprises a depletion region between the n-doped region and the p-doped region.

9. The semiconductor device of claim 7, wherein:
a first dopant concentration of the n-doped region is lower than a second dopant concentration of the first doped semiconductor structure; and
a third dopant concentration of the p-doped region is lower than a fourth dopant concentration of the second doped semiconductor structure.

10. The semiconductor device of claim 9, wherein:
the first doped semiconductor structure is an n-doped semiconductor structure; and
the second doped semiconductor structure is a p-doped semiconductor structure.

11. The semiconductor device of claim 1, wherein:
the second width of the second portion of the waveguide is at least three times larger than the constant first width of the first portion of the waveguide.

12. A method for forming a semiconductor device, comprising:
forming a semiconductor layer over a first dielectric layer;
patterning the semiconductor layer to form a patterned semiconductor layer comprising a waveguide, wherein the waveguide comprises:
  a first portion having a first width; and
  a second portion having a second width larger than the first width, wherein the second portion of the waveguide is between a first portion of the patterned semiconductor layer and a second portion of the patterned semiconductor layer;
forming a patterned photoresist over the patterned semiconductor layer, wherein the patterned photoresist defines an opening exposing the first portion of the patterned semiconductor layer;
doping the first portion of the patterned semiconductor layer through the opening to form an n-doped semiconductor structure adjacent the second portion of the waveguide; and
doping the second portion of the patterned semiconductor layer to form a p-doped semiconductor structure adjacent the second portion of the waveguide.

13. The method of claim 12, wherein:
patterning the semiconductor layer comprises forming the waveguide to comprise a third portion having a first tapered sidewall and a second tapered sidewall;
the third portion of the waveguide is between the first portion of the waveguide and the second portion of the waveguide;
the first tapered sidewall has a first slope and the second tapered sidewall has a second slope; and
the second slope is opposite in polarity relative to the first slope.

14. The method of claim 12, comprising:
forming a second dielectric layer over the first dielectric layer, wherein:
  a first sidewall of the n-doped semiconductor structure is adjacent a first sidewall of the second dielectric layer; and
  a second sidewall of the p-doped semiconductor structure is adjacent a second sidewall of the second dielectric layer.

15. The method of claim 12, comprising:
doping a first sub-portion of the second portion of the waveguide to form an n-doped region; and
doping a second sub-portion of the second portion of the waveguide to form a p-doped region.

16. The method of claim 15, wherein:
the n-doped region of the second portion of the waveguide is adjacent the n-doped semiconductor structure; and
the p-doped region of the second portion of the waveguide is adjacent the p-doped semiconductor structure.

17. A semiconductor device, comprising:
a waveguide over a first dielectric layer, wherein:
  a first portion of the waveguide has a constant first width;
  a second portion of the waveguide has a constant second width larger than the constant first width;
  the constant second width is at least three times larger than the constant first width;
  a third portion of the waveguide extends from the first portion of the waveguide to the second portion of the waveguide;
  the third portion of the waveguide has a first tapered sidewall extending from a first side of the third portion of the waveguide to a second side of the third portion of the waveguide; and
  the first side of the third portion of the waveguide is adjacent the first portion of the waveguide and the second side of the third portion of the waveguide is adjacent the second portion of the waveguide;
an n-doped semiconductor structure; and
a p-doped semiconductor structure, wherein the second portion of the waveguide is between the n-doped semiconductor structure and the p-doped semiconductor structure.

18. The semiconductor device of claim 17, wherein:
the second portion of the waveguide comprises an n-doped region and a p-doped region.

19. The semiconductor device of claim 18, wherein:
the n-doped region of the second portion of the waveguide is adjacent the n-doped semiconductor structure; and
the p-doped region of the second portion of the waveguide is adjacent the p-doped semiconductor structure.

20. The semiconductor device of claim 18, wherein:
the second portion of the waveguide comprises a depletion region between the n-doped region and the p-doped region.

* * * * *